(12) United States Patent
Kato et al.

(10) Patent No.: US 8,638,243 B2
(45) Date of Patent: Jan. 28, 2014

(54) DATA COMPRESSION DEVICE, DATA COMPRESSION METHOD, AND MEDIUM

(75) Inventors: Mamoru Kato, Tokyo (JP); Mitsunori Kori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/520,590

(22) PCT Filed: Mar. 3, 2010

(86) PCT No.: PCT/JP2010/053423
§ 371 (c)(1),
(2), (4) Date: Jul. 5, 2012

(87) PCT Pub. No.: WO2011/108089
PCT Pub. Date: Sep. 9, 2011

(65) Prior Publication Data
US 2012/0280838 A1 Nov. 8, 2012

(51) Int. Cl.
*H03M 7/00* (2006.01)
(52) U.S. Cl.
USPC .............. 341/59; 341/58; 341/65; 341/67; 341/107; 382/238; 382/239; 375/240.03; 375/240.15; 375/240.12
(58) Field of Classification Search
USPC .......... 341/58, 59, 65, 67, 106, 107; 382/238, 382/239, 420, 416; 375/240.03, 240.15, 375/240.12, 240.24
See application file for complete search history.

(56) References Cited

U.S. PATENT DOCUMENTS 4,215,374 A * 7/1980 Mizuno .................. 382/238
4,633,325 A * 12/1986 Usubuchi ............... 382/238
(Continued)

FOREIGN PATENT DOCUMENTS

JP 03 055919 3/1991
JP 05 292329 11/1993
(Continued)

OTHER PUBLICATIONS

International Search Report issued on May 25, 2010 in PCT/JP10/53423 filed on Mar. 3, 2010.

*Primary Examiner* — Linh Nguyen
(74) *Attorney, Agent, or Firm* — Oblon, Spivak, McClelland, Maier & Neustadt, L.L.P.

(57) ABSTRACT

A prediction error calculation part calculates a prediction error for each input data. A prediction error encoding part generates a prediction error code by encoding the value of the prediction error. A run-length counting part counts the run-length of the prediction error. When the value of the prediction error changes, a run-length encoding part generates a run-length code by encoding the run-length counted. A code connecting part generates a connected code by connecting the run-length code to the prediction error code of a corresponding prediction error. When the value of the prediction error is a particular value, a prediction error checking part selects a connected code for the prediction error, as an output code. When the value of the prediction error is a different value, the prediction error checking part selects a prediction error code for the prediction error, as an output code. A code output part outputs the output code selected.

13 Claims, 10 Drawing Sheets

(56) References Cited

U.S. PATENT DOCUMENTS

| | | | |
|---|---|---|---|
| 5,883,976 A | | 3/1999 | Ohsawa |
| 6,556,624 B1* | | 4/2003 | Orchard et al. .......... 375/240.12 |
| 6,920,177 B2* | | 7/2005 | Orchard et al. .......... 375/240.12 |
| 6,990,242 B2* | | 1/2006 | Malvar ........................ 382/238 |
| 7,233,702 B2* | | 6/2007 | Shiraishi ...................... 382/245 |
| 7,650,039 B2* | | 1/2010 | Kajiwara et al. ............. 382/238 |
| 8,345,968 B2* | | 1/2013 | Sekiguchi et al. ............ 382/166 |
| 8,374,445 B2* | | 2/2013 | Benndorf ...................... 382/238 |
| 8,422,803 B2* | | 4/2013 | Sekiguchi et al. ............ 382/233 |
| 8,447,123 B2* | | 5/2013 | Chen et al. ................... 382/232 |
| 2006/0210176 A1* | | 9/2006 | Kajiwara et al. ............. 382/232 |
| 2011/0293008 A1* | | 12/2011 | Suzuki ..................... 375/240.15 |

FOREIGN PATENT DOCUMENTS

| | | |
|---|---|---|
| JP | 05 316370 | 11/1993 |
| JP | 07 298062 | 11/1995 |
| JP | 08 186824 | 7/1996 |
| JP | 8-186824 A | 7/1996 |
| JP | 10 105372 | 4/1998 |
| JP | 11 69165 | 3/1999 |
| JP | 2002 112040 | 4/2002 |
| JP | 2005 151223 | 6/2005 |
| JP | 2007 88683 | 4/2007 |
| JP | 2008 109194 | 5/2008 |
| JP | 2009 182810 | 8/2009 |

* cited by examiner

Fig. 8

| TIMING | n | n+1 | n+2 | n+3 | n+4 | n+5 |
|---|---|---|---|---|---|---|
| INPUT DATA VALUE | 8 | 10 | 10 | 10 | 11 | 13 |
| PREDICTION ERROR | 1 | 2 | 0 | 0 | 1 | 2 |
| RUN-LENGTH | 1 | 1 | 1 | 2 | 1 | 1 |
| CONNECTED CODE (Cer) | OMIS-SION | (1+1) | (2+1) | NONE | (0+2) | (1+1) |
| OUTPUT CODE (E=0) | OMIS-SION | 1 (Ce) | 2 (Ce) | NONE | (0+2) (Cer) | 1 (Ce) |
| OUTPUT CODE (\|E\|=1) | OMIS-SION | (1+1) (Cer) | 2 (Ce) | 0 (Ce) | 0 (Ce) | (1+1) (Cer) |

DATA COMPRESSION DEVICE, DATA COMPRESSION METHOD, AND MEDIUM

TECHNICAL FIELD

The present invention relates to a data compression technique.

BACKGROUND ART

Various methods have conventionally been employed for lossless data compression.

For example, a method of combining a prediction error with variable-length encoding depending on the frequency of appearance, by utilizing predictive encoding is generally employed.

In an area where data does not change, a method of using run-length encoding is generally employed.

Patent Literature 1 discloses a technique with which, when encoding an image, predictive encoding and variable-length encoding are performed if a plurality of pieces of predetermined data do not coincide with the past record of the input data. If they coincide, the encoding mode shifts to a run-length encoding mode, and run-length encoding is carried out.

Patent Literature 1 also discloses that when decoding is to be performed, the encoding mode shifts to the run-length encoding mode if the plurality of pieces of predetermined data coincide with the record of the decoded data, so the encoded image can be decoded.

CITATION LIST

Patent Literature

Patent Literature 1: JP 2008-109194

SUMMARY OF INVENTION

Technical Problem

In Patent Literature 1, run-length encoding is performed only for an area where the input data does not change. Data that continuously changes in a manner to match a prediction model, such as data that increases or decreases with a constant gradient, is not run-length encoded. This poses a problem in terms of compression efficiency.

Also, the run-length encoding mode needs to be determined with comparing a plurality of pieces of data. Then, the computation amount needed for mode determination increases, leading to a lower execution speed.

A main object of the present invention is to solve the above problems. Its major object is to provide a data compression technique which, in compression of time-series data such as sensor data of a temperature or electric energy, can efficiently compress even data that changes to match a prediction model such as data that increases or decreases with a constant gradient, and can decrease the computation amount, so that the execution speed of compression/decompression can be increased.

Solution to Problem

A data compression device according to the present invention is a data compression device which sequentially inputs data, and includes:

a prediction error calculation part which predicts a value of data before inputting the data, and each time the data is inputted, calculates a difference between a value of the input data which is inputted and a prediction value which is predicted for the input data, as a prediction error;

a prediction error encoding part which encodes a value of the prediction error calculated and generates a prediction error code, each time the prediction error is calculated by the prediction error calculation part;

a run-length counting part which counts a run-length of the prediction error calculated by the prediction error calculation part;

a run-length encoding part which encodes the run-length counted by the run-length counting part and generates a run-length code, when the value of the prediction error changes;

a code connecting part which connects the run-length code generated, to a prediction error code of a prediction error corresponding to the run-length code and generates a connected code, each time the run-length code is generated by the run-length encoding part; and a code selection part which selects either one of the prediction error code for the prediction error and the connected code, as an output code, depending on the value of the prediction error calculated by the prediction error calculation part.

Advantageous Effects of Invention

According to the present invention, a prediction error is calculated for input data, and the run-length of the prediction error is counted. Therefore, data that increases or decreases with a constant gradient can also be run-length encoded efficiently.

Also, according to the present invention, either one of the prediction error code and the connected code is selected as an output code depending on the value of the prediction error. By appropriately setting a prediction error for which a connected code is to be selected, to match the fluctuation characteristics of the data value, the compression efficiency can be increased.

BRIEF DESCRIPTION OF DRAWINGS

FIG. 8 is a chart showing examples of an input data value, prediction error, run-length, and the like according to Embodiments 1 and 2.

DESCRIPTION OF EMBODIMENTS

Embodiment 1

Figure 1:
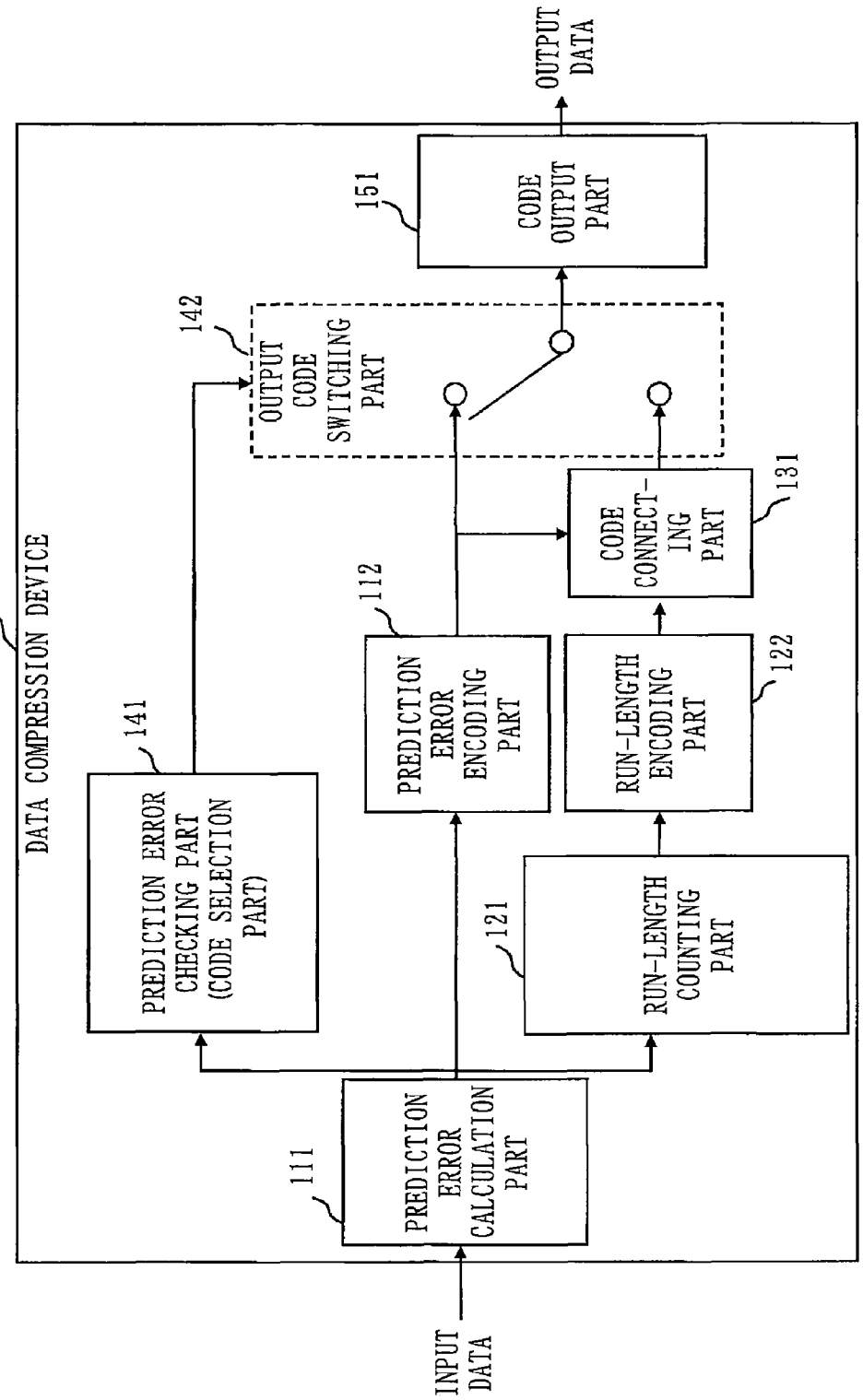
FIG. 1 is a diagram showing a configuration of a data compression device according to Embodiment 1.

FIG. 1 is a diagram showing an example of the configuration of the function block of a data compression device 100 according to this embodiment.

The data compression device 100 sequentially inputs data (input data) to be compressed, compresses the data, and outputs output data.

The input data is time-series data such as sensor data including an electric energy or temperature. The input data in which data are arranged in line with time development, is favorable.

The unit of processing for the input data is a fixed length such as an 8-bit, 16-bit, 32-bit, or 64-bit which is appropriate for a process by a CPU (Central Processing Unit). When the target data is a fixed-point value or an integer value, a high speed computation is available.

For example, when using temperature data having first decimal place, the original data may be multiplied by 10 so it can be dealt with as a 32-bit integer.

The output data is variable-length encoded, packed into a unit of processing, and outputted.

In the following explanation, note that the unit of processing is 32 bits.

The data compression device 100 includes a prediction error calculation part 111, a prediction error encoding part 112, a run-length counting part 121, a run-length encoding part 122, a code connecting part 131, a prediction error checking part 141, an output code switching part 142, and a code output part 151.

The prediction error calculation part 111 inputs the input data in a predetermined unit of processing, and calculates a prediction error E by obtaining the difference between a prediction value which has been obtained by predicting data currently under processing by using the record of the past input data, and actual data currently under processing.

In other words, the prediction error calculation part 111 predicts the value of data before inputting the data. Each time the prediction error calculation part 111 inputs data, it calculates the difference between the value of the input data inputted and a prediction value which has been obtained by predicting the input data, as the prediction error E.

For example, the prediction error calculation part 111 can use the value of data inputted immediately before the data currently under processing, as the prediction value.

Namely, the prediction error calculation part 111 uses the value of data inputted immediately before data to be inputted next, as the prediction value of the data to be inputted next.

In time-series data such as sensor data, when the sampling interval of the sensor is short for a change of a measurement target, a change width between time-series signals is small. Then, the difference (prediction error E) from the immediately preceding data converges to 0 or a value having a small absolute value. Consequently, the compressibility can be increased.

For example, this case applies to data obtained by measuring a room temperature until its first decimal place every one minute.

The method of obtaining the difference from the immediately preceding data (to be referred to as a difference calculus hereinafter) enables calculation of a prediction error with the minimum computation amount, leading to a high-speed compression process.

According to another example, the prediction error calculation part 111 may perform linear prediction using immediately preceding N (N≥2) pieces of data.

In other words, the prediction error calculation part 111 may calculate the prediction value of the data to be inputted next by performing linear computation using two or more pieces of data that have been inputted prior to the data to be inputted next.

More specifically, parameters a and b of the following linear equation:

$$y = ax + b$$

are obtained by the least square method using N sets of data $(x_1, y_1), (x_2, y_2), \ldots, (x_N, y_N)$ where x is the measurement time and y is the data.

Note that the least square method is conducted based on the following equation.

$$a = \frac{N\sum_{k=1}^{N} x_k y_k - \sum_{k=1}^{N} x_k \sum_{k=1}^{N} y_k}{N\sum_{k=1}^{N} x_k^2 - \left(\sum_{k=1}^{N} x_k\right)^2}$$ [Numerical Expression 1]

$$b = \frac{\sum_{k=1}^{N} x_k^2 \sum_{k=1}^{N} y_k - \sum_{k=1}^{N} x_k y_k \sum_{k=1}^{N} x_k}{N\sum_{k=1}^{N} x_k^2 - \left(\sum_{k=1}^{N} x_k\right)^2}$$

For example, when prediction is to be performed using immediately preceding three pieces of data, provided that the sampling intervals are equal, a prediction value $y_4'$ can be obtained in accordance with the following expression.

$$y_4' = \frac{-2y_1 + y_2 + 4y_3}{3}$$ [Numerical Expression 2]

The prediction value $y_4'$ is modified to an integer by round-off or the like, and the prediction error E from actually inputted successive data $y_4$, that is, $E = y_4' - y_4$, is calculated.

As a result, when dealing with data that increases (or decreases) with an almost constant ratio, such as sensor data of electric energy measured by an ampere-hour meter, the prediction error E is converged to 0 or a value having a small absolute value. Consequently, the compressibility can be increased.

Each time the prediction error calculation part 111 calculates the prediction error E, the prediction error encoding part 112 variable-length encodes the calculated prediction error E and outputs a prediction error code Ce.

The variable-length encoding method may use the gamma code or delta code.

The gamma code and delta code are methodologies that encode a value having a small absolute value to a code having a smaller code length. In this embodiment, the prediction error E is 0 or a value having a small absolute value, as described above. Thus, a high compressibility can be expected.

Since the gamma code and delta code are for fixed encoding, generation of a table of symbol appearance frequency which is required of an entropy code such as arithmetic coding or Huffman coding is unnecessary. The computation amount is thus decreased, and a high-speed process is possible.

More specifically, with the gamma code, encoding is performed in the following manner.

Subsequent to (bit count of encoding target data expressed as a binary number −1) pieces of 0 (binary), the encoding target data is outputted in the form of a binary number.

For example, see below (the following numbers are all binary numbers):

1→1 ((1 bit−1) pieces of 0 followed by 1)
10→010 ((2 bits−1) pieces of 0 followed by 10)
100→00100 ((3 bits−1) pieces of 0 followed by 100)

If the bit count of the target data is 5 or less, a shorter code can be formed with the gamma code. Hence, concerning data in which distribution of prediction errors E is centered around 0, a higher compressibility can be achieved with the gamma code.

If the prediction errors E fall outside 0 frequently, for example, where sensor data that fluctuates largely is concerned, a higher compressibility can be achieved by using the delta code.

The following explanation will be given by taking the gamma code as an example. The same explanation applies to the delta code as well.

The gamma code or delta code is to encode a positive integer. In order to encode a prediction error E including 0 or a negative value, the prediction error encoding part 112 performs the following transform prior to gamma encoding or delta encoding.

$$M_1(E) = \begin{cases} 1 & \text{when } E = 0 \\ 2|E| & \text{when } E > 0 \\ 2|E| + 1 & \text{when } E < 0 \end{cases}$$ [Numerical Expression 3]

Namely, when the prediction error E=0, the value is set to 1. When the prediction error E>0, left shift is performed. When the prediction error E<0, left shift is performed, and the LSB (Least Significant Bit) is set to 1.

With this transform, a value having a small absolute value can be transformed as a value having a small absolute value. Hence, a high compressibility is expected with gamma encoding or delta encoding.

In the transformation M1, when the prediction error E takes a minimum value (expressed as −2147483648 by decimal notation; or $-2^{31}$) that a signed integer corresponding to the unit of processing (for example, 32 bits) can hold, overflow occurs as the result of left shift.

When the prediction error E is a minimum value Emin (expressed as −2147483648 by decimal notation; or $-2^{31}$ where the unit of processing is 32 bits), the prediction error encoding part 112 outputs a fixed code corresponding to Emin without performing a transform by M1.

Then, the unit of processing need not be extended for overflow, so that the processing speed can be increased.

For example, given Emin=0x80000000 (hexadecimal), M1 (Emin)=0x100000001 (hexadecimal) which is 33-bits, is obtained.

Hence, when E=Emin, a code corresponding to it is outputted directly.

For example, with the gamma code, a 65-bit code shown below is outputted without being subjected to transform by the transformation M1.

[Numerical Expression 4]
0b00000000000000000000000000000000100000000000-00000000000000000000001 (binary)

Alternatively, M1 (E) becomes a 33-bit code only in a single case where E=Emin. Hence, decoding is possible if only the bit count of E being 33 in the gamma code is known.

Therefore, by encoding the target data to a 33-bit code shown below, the compressibility can be further enhanced.

[Numerical Expression 5]
0b000000000000000000000000000000001(binary)

If the prediction error E often becomes an integer equal to or larger than 0 according to the characteristics of the data, then the following transformation equation may also be employed.

$$M_2(E) = \begin{cases} E+1 & \text{when } E \geq 0 \\ E & \text{when } E_{min} < E < 0 \\ |E| \times 2 & \text{when } E = E_{min} \end{cases}$$ [Numerical Expression 6]

For example, if the target data is electric energy data of an ampere-hour meter, usually the data only increases, and is reset to 0 when it exceeds the significant digit count. Accordingly, a negative prediction error is supposed to seldom appear.

Therefore, a higher compressibility can be expected with the transformation equation M2 in which the positive-value bit count is smaller than in the transformation equation M1.

With the transformation equation M2, overflow occurs in the same manner as with M1. By employing a fixed code similar to that in the case of M1, the unit of processing need not be extended for overflow, and the processing speed can be increased.

The run-length counting part 121 counts the number of times with which the prediction error E takes the same value.

The run-length counting part 121 holds a prediction error Ep of the last time. If a prediction error Ec currently under processing is equal to Ep, the run-length counting part 121 adds 1 to a variable run-length R.

If Ec is different from Ep, the run-length counting part 121 outputs the value of the run-length R to the run-length encoding part 122, and the run-length encoding part 122 encodes the run-length.

The run-length counting part 121 also resets the run-length R to 1.

Even if Ec is equal to Ep, when the run-length R+1 exceeds the designated maximum value, the run-length counting part 121 may output the run-length R to the run-length encoding part 122, so as to reset the run-length R to 1.

The run-length encoding part 122 variable-length encodes the value of the run-length R counted by the run-length counting part 121, and outputs a run-length code Cr.

The variable-length encoding method may use the gamma code or the delta code.

Concerning sensor data such as electric energy or temperature, the maximum frequency distribution of run-length appearance is 1 (1 is the mode). There is a tendency that the larger the value, the less frequently the value appears. Therefore, a high compression effect can be expected with the gamma code or delta code, as described previously.

With the gamma code or delta code, the computation amount can be decreased, and a higher-speed process becomes possible. This has also been described previously.

The run-length is always an integer equal to or larger than 1. Hence, an extra transform as described concerning encoding of a prediction error is unnecessary, and the run-length is encoded directly.

Each time the run-length encoding part 122 generates a run-length code, the code connecting part 131 connects the prediction error code Ce by the prediction error encoding part 112 with the run-length code Cr by the run-length encoding part 122, to obtain one connected code Cer.

In the connected code Cer, the prediction error code Ce by the prediction error encoding part 112 comes first.

More specifically, the connected code Cer is as follows.

$$Cer = Ce + Cr \text{ (+ means connecting)}$$

The prediction error checking part 141 controls the output code switching part 142 based on the value of the prediction error E, and selects which one of the codes Ce and Cer is to be the output code.

The prediction error checking part 141 is an example of a code selection part.

When the sensor data fluctuates comparatively less and includes comparatively little noise, the prediction error E=0 continues frequently. A connected code Cer is to be an output code when E=0 and a prediction error code Ce is to be an output code otherwise, then the compressibility can be enhanced.

Alternatively, with sensor data that increases or decreases moderately at a constant rate, when a prediction error E is calculated by the difference calculus described above, +1 or −1 continues frequently.

Hence, the connected code Cer is to be the output code when E=1 or −1 and the prediction error code Ce is to be the output code otherwise, then the compressibility can be enhanced.

Furthermore, with sensor data that increases or decreases with a large gradient, even when the prediction error E takes a larger value (for example, the prediction error E is 5), the connected code Cer is to be the output code, then the compressibility may be able to be enhanced.

In general, the larger the absolute value of the prediction error E, the lower the probability that this prediction error E continues. It is rational to determine that a connected code Cer is to be outputted if the absolute value of the prediction error E is equal to or smaller than a designated threshold, and that a prediction error code Ce is to be outputted if the absolute value of the prediction error E exceeds this threshold.

When the run-length is small for every prediction error, the compressibility may be enhanced by not performing run-length encoding at all.

In such a case, it is effective to select the prediction error code Ce as the output code regardless of the value of the prediction error E.

In the above manner, which one is to be outputted as the output code may be switched between the prediction error code Ce and the connected code Cer in which the prediction error code and a run-length code are connected, depending on the value of the prediction error E. Then, instead of performing run-length encoding for only a portion where a constant value continues as in the conventional case, run-length encoding is adaptably added also when the sensor data of electric energy or temperature increases or decreases at a constant rate, the compressibility can be enhanced.

In a conventional case, in order for switching to the run-length mode, the record of a plurality of pieces of past data needs to be always collated when encoding and decoding, which leads to the problem of a large computation amount. According to this embodiment, however, in both encoding and decoding, the presence/absence of a run-length code can be determined only by checking a prediction error. As a result, the computation amount can be decreased and a high execution speed can be realized.

The code output part 151 packs codes having variable bit counts selected by the output code switching part 142 into a unit of processing (for example, 32 bits), and outputs the resultant code as the output data.

According to the encoding method described so far, codes can be decoded by examining them one bit by one bit sequentially. Hence, in packing, the codes are only packed tightly one bit by one bit starting with the MSB (Most Significant Bit) until the LSB into a register corresponding to the unit of processing. A bit indicating the border between codes or a bit indicating the presence/absence of a run-length code is unnecessary.

These processes can be realized by a shift operation and an OR operation.

One code may be across a plurality of units of processing. In that case, the LSB of one unit of processing may be followed by the MSB of the immediately subsequent unit of processing.

Finally, output data packed in units of processing, the number of units of processing of the output data, and the number of codes contained in the output data are outputted.

When the prediction error code Ce is to be outputted, the code output part 151 may able to output one code each time one piece of input data is inputted. Preferably, the code output part 151 is configured to output the prediction error code Ce when encoding the run-length R.

More specifically, in encoding the run-length R, when the connected code Cer is selected as the output code, the code output part 151 outputs the connected code Cer. When the prediction error code Ce is selected as the output code, the code output part 151 outputs the prediction error code Ce for R times.

When outputting codes that appear frequently, the code output part 151 outputs k pieces of such codes at one time.

As described earlier, in a prediction error and a run-length, 0 and a value having a small absolute value appear frequently. Consequently, E=0, 1, −1, and the like appear frequently.

For example, when E=0 and R=4, since Ce=1 (binary), by generating an output code C=1111 (binary), one process of packing into a unit of processing leads to outputting four times.

The packing process is realized by bit manipulation. Accordingly, when the code length is small and the frequency is high, there is a problem that the computation amount of the CPU increases. Concerning this, if the above measures are taken, the computation amount can be decreased, so that high-speed execution can be realized.

In the above explanation, the variable-length encoding method uses the gamma code or delta code. Another integer encoding method which uses the unary code, the omega code, the Golomb code, or the Rice code may be employed instead.

Also, the arithmetic code, the Range Coder, the Huffman code, the Shannon code, or an encoding method which uses a fixed table may be employed.

The operation of the data compression device 100 will now be described.

Figure 2:
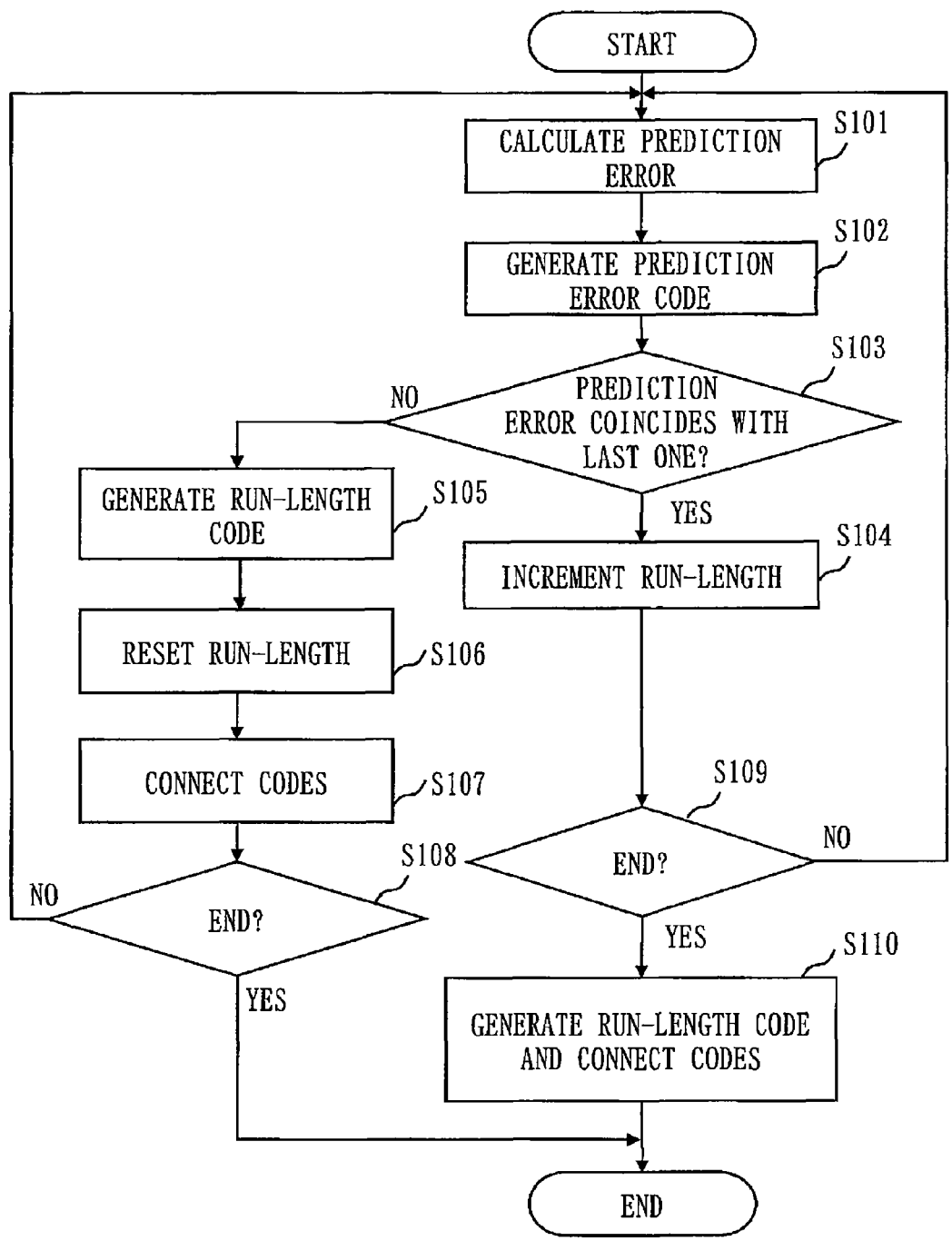
FIG. 2 is a flowchart showing an operation example of the data compression device according to Embodiment 1.

FIG. 2 is a flowchart showing a flow example of the compression process of the data compression device 100 according to this embodiment.

In compression step S101, using the input data and the past record data, the prediction error calculation part 111 calculates the prediction error Ec.

In compression step S102, the prediction error encoding part 112 generates the prediction error code Ce of the prediction error Ec by means of the gamma code or delta code. The prediction error encoding part 112 keeps in the buffer the prediction error code Ce generated this time until next prediction error code generation. In the next prediction error code generation, the prediction error encoding part 112 outputs the prediction error code Ce in the buffer to the output code switching part 142 and the code connecting part 131.

In compression step S103, the run-length counting part 121 checks whether the prediction error Ec coincides with the last prediction error Ep. If they coincide, in compression step S104, the run-length counting part 121 increments the run-length R by 1.

In compression step S109, whether the input data is ended or not is checked. If the input data is not ended, the flow returns to compression step S101.

If the input data is ended, in compression step S110, the run-length encoding part 122 generates a run-length code Cr for the run-length R counted by the run-length counting part 121. The code connecting part 131 generates the connected code Cer by connecting the prediction error code Ce and the run-length code Cr. Then, the compression steps are ended.

If the prediction error Ec does not coincide with the last prediction error Ep in step S103, the run-length counting part 121 outputs the run-length R to the run-length encoding part 122 and the run-length encoding part 122 generates a run-length code Cr using the gamma code or the delta code in compression step S105.

In compression step S106, the run-length counting part 121 resets the run-length to 1.

In compression step S107, the code connecting part 131 generates a connected code Cer by connecting the prediction error code Ce by the prediction error encoding part 112 and the run-length code Cr by the run-length encoding part 122.

The prediction error code to be connected with the run-length code Cr is the prediction error code Ce of the immediately preceding input data which is kept in the buffer of the prediction error encoding part 112.

In compression step S108, it is checked whether the input data is ended or not. If the input data is not ended, the flow returns to compression step S101. If the input data is ended, the compression steps are ended.

Compression step S102 can be performed in parallel with compression steps S103 and S104, or with compression steps S103, S105, and S106.

Figure 3:
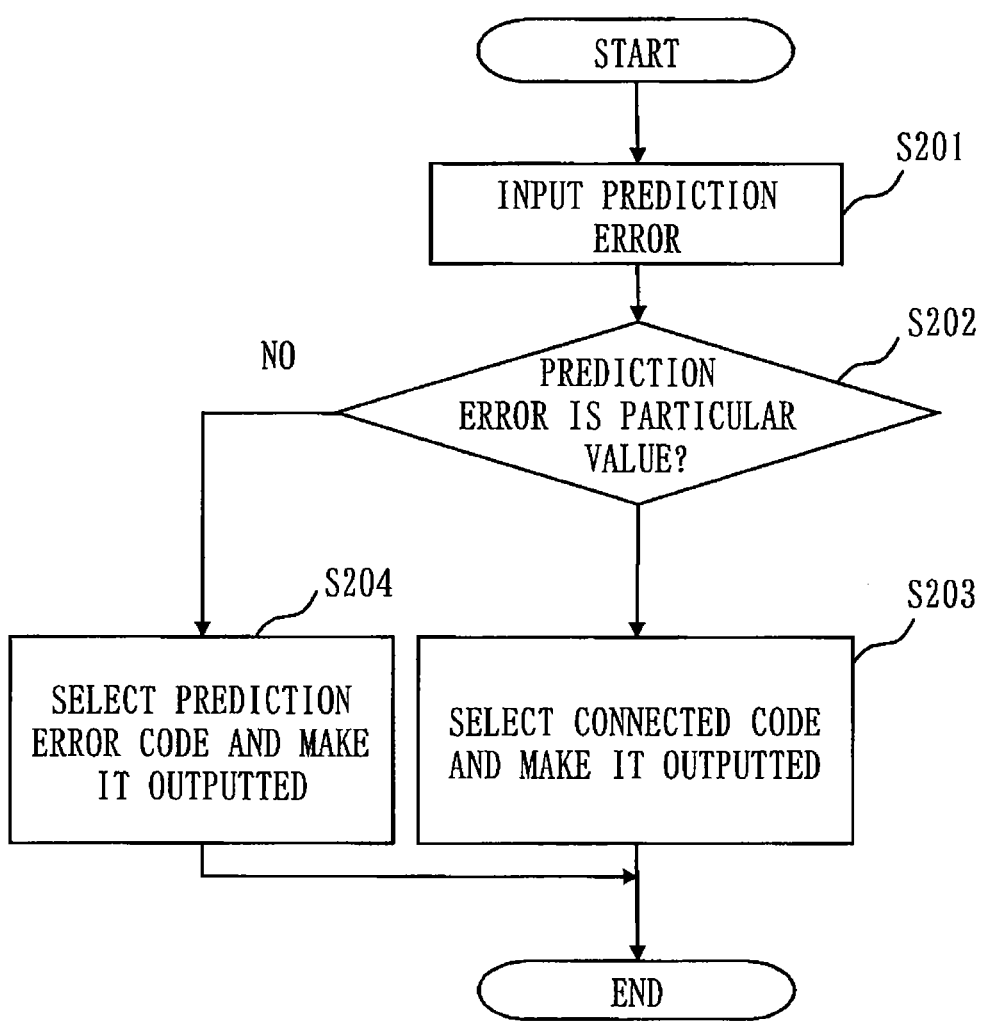
FIG. 3 is a flowchart showing an operation example of the data compression device according to Embodiment 1.

FIG. 3 is a flowchart showing a flow example of code outputting of the data compression device 100 according to this embodiment.

In code output step S201, the prediction error checking part 141 inputs the prediction error Ec calculated by the prediction error calculation part 111 in compression step S101 of FIG. 2.

Then, in code output step S202, the prediction error checking part 141 checks whether or not the prediction error Ec is a particular value (for example, 0).

If the prediction error Ec is the particular value, in code output step S203, the prediction error checking part 141 selects the connected code Cer as the output code, and operates the output code switching part 142 to output the connected code Cer.

Consequently, when the connected code Cer is generated in compression step S107 of FIG. 2, the connected code Cer is outputted to the code output part 151.

In code output step S202, if the prediction error Ec is not the particular value, in code output step S204, the prediction error checking part 141 selects the prediction error code Ce as the output code, and operates the output code switching part 142 to output the prediction error code Ce.

Consequently, the prediction error code Ce generated in compression step S102 of FIG. 2 is outputted to the code output part 151.

An operation example of the data compression device 100 according to this embodiment will be explained by using the specific data values shown in FIG. 8.

In the example of FIG. 8, the prediction value is the value of immediately preceding input data.

In FIG. 8, suppose that the data value of input data that has been inputted the nth time is 8.

When the prediction error E of the nth time input data is calculated, 1 is obtained. Hence, at the time point where the nth time data is inputted, the run-length R of the prediction error E=1 is 1. At this time point, the run-length R of the prediction error E=1 has not been determined yet.

The prediction error encoding part 112 generates a prediction error code Ce (=1) and keeps it in the buffer in the prediction error encoding part 112.

The prediction error checking part 141 checks whether or not the prediction error E=1 coincides with the particular value (code output step S202 in FIG. 3). If the particular value is 0 (E=0), since the prediction error E=1 is not the particular value, the prediction error checking part 141 selects the prediction error code Ce (=1) as the output code. In the next ((n+1)th) time, the prediction error code Ce (=1) in the buffer is outputted as the output code.

If the particular value is each of +1 and −1 ($|E|=1$), since the prediction error E=1 is the particular value, the prediction error checking part 141 selects the connected code Cer as the output code. In the next ((n+1)th) time or after the next time, the connected code Cer is outputted as the output code. At this time point, the connected code Cer has not been generated yet.

In the (n+1)th time, input data having a data value of 10 is inputted.

The prediction error E in the (n+1)th time is 2 (10−8=2), which is different from the prediction error E=1 of the nth time. Hence, the run-length R of the prediction error E=1 is determined at 1.

The prediction error encoding part 112 generates a prediction error code Ce (=2) and keeps it in the buffer in the prediction error encoding part 112.

The prediction error checking part 141 checks whether or not the prediction error E=2 coincides with the particular value (code output step S202 in FIG. 3).

If the particular value is 0 (E=0), since the prediction error E=2 is not the particular value, the prediction error encoding part 112 selects the prediction error code Ce (=2) as the output code. In the next ((n+2)th) time, the prediction error code Ce (=2) in the buffer is outputted as the output code.

If the particular value is each of +1 and −1 ($|E|=1$) as well, since the prediction error E=2 is not the particular value, the prediction error encoding part 112 selects the prediction error code Ce (=2) as the output code. In the next ((n+2)th) time, the prediction error code Ce (=2) in the buffer is outputted as the output code.

Since the run-length R of the prediction error E=1 is determined at 1, the run-length counting part 121 outputs the run-length R=1 to the run-length encoding part 122, so as to generate a run-length code Cr.

Furthermore, the prediction error code Ce (=1) of the last time is outputted from the buffer in the prediction error encoding part 112 and connected with the run-length code Cr (=1) in the code connecting part 131, so that a connected code Cer (=(1+1)) is generated.

The run-length R of the new prediction error E=2 becomes 1. At this time point, the run-length R of the new prediction error E=2 has not been determined yet.

If the particular value is 0 (E=0), as the result of the check by the prediction error checking part 141 for the prediction error E=1 of the nth time (code output step S202), the prediction error code Ce (=1) has been selected as the output code. Thus, the prediction error code Ce (=1) is outputted as the output code.

If the particular value is each of +1 and −1 (|E|=1), as the result of the check by the prediction error checking part 141 for the prediction error E=1 of the nth time (code output step S202), the connected code Cer has been selected as the output code. Thus, the connected code Cer (=(1+1)) generated in the (n+1)th time is outputted as the output code.

In the (n+2)th time, input data having a data value of 10 is inputted.

The prediction error E in the (n+2)th time is 0 (10−10=0), which is different from the prediction error E=2 of the (n+1)th time. Hence, the run-length R of the prediction error E=2 is determined at 1.

The prediction error encoding part 112 generates a prediction error code Ce (=0) and keeps it in the buffer in the prediction error encoding part 112.

The prediction error checking part 141 checks whether or not the prediction error E=0 coincides with the particular value (code output step S202 in FIG. 3).

If the particular value is 0 (E=0), since the prediction error E=0 is the particular value, the prediction error checking part 141 selects the connected code Cer as the output code. In the next ((n+3)th) time or after the next time, the connected code Cer is outputted as the output code. At this time point, the connected code Cer has not been generated yet.

If the particular value is each of +1 and −1 (|E|=1), since the prediction error E=0 is not the particular value, the prediction error encoding part 112 selects the prediction error code Ce (=0) as the output code. In the next ((n+3)th) time, the prediction error code Ce (=0) in the buffer is outputted as the output code. Since the run-length R of the prediction error E=2 is determined at 1, the run-length counting part 121 outputs the nm-length R=1 to the run-length encoding part 122, so as to generate a run-length code Cr.

Furthermore, the prediction error code Ce (=2) of the last time is outputted from the buffer in the prediction error encoding part 112 and connected with the run-length code Cr (=1) in the code connecting part 131, so that a connected code Cer (=(2+1)) is generated.

The run-length R of the new prediction error E=0 becomes 1. At this time point, the run-length R of the new prediction error E=0 has not been determined yet.

If the particular value is 0 (E=0), as the result of the check by the prediction error checking part 141 for the prediction error E=2 of the (n+1)th time (code output step S202), the prediction error code Ce (=2) has been selected as the output code. Thus, the prediction error code Ce (=2) generated in the (n+1)th time is outputted as the output code.

If the particular value is each of +1 and −1 (|E|=1) as well, as the result of the check by the prediction error checking part 141 for the prediction error E=2 of the (n+1)th time (code output step S202), the prediction error code Ce (=2) has been selected as the output code. Thus, the prediction error code Ce (=2) generated in the (n+1)th time is outputted as the output code.

In the (n+3)th time, input data having a data value of 10 is inputted.

The prediction error E in the (n+3)th time is 0 (10−10=0), which is the same as the prediction error E=0 of the (n+2)th time. Hence, the run-length R of the prediction error E=0 becomes 2. At this time point, the run-length R of the prediction error E=0 has not been determined yet.

The prediction error encoding part 112 generates a prediction error code Ce (=0) and keeps it in the buffer in the prediction error encoding part 112.

The prediction error checking part 141 checks whether or not the prediction error E=0 coincides with the particular value (code output step S202 in FIG. 3).

If the particular value is 0 (E=0), since the prediction error E=0 is the particular value, the prediction error checking part 141 selects the connected code Cer as the output code. In the next ((n+4)th) time or after the next time, the connected code Cer is outputted as the output code. At this time point, the connected code Cer has not been generated yet.

If the particular value is each of +1 and −1 (|E|=1), since the prediction error E=0 is not the particular value, the prediction error encoding part 112 selects the prediction error code Ce (=0) as the output code. In the next ((n+4)th) time, the prediction error code Ce (=0) in the buffer is outputted as the output code.

Since the run-length R of the prediction error E=0 has not been determined yet, a run-length R is not outputted by the run-length counting part 121 nor is generated a run-length code Cr.

As a result, the connected code Cer is not generated either.

If the particular value is 0 (E=0), as the result of the check by the prediction error checking part 141 for the prediction error E=0 of the (n+2)th time (code output step S202), the connected code Cer has been selected as the output code. At this time point, the connected code Cer has not been generated yet, and accordingly no code is outputted.

If the particular value is each of +1 and −1 (|E|=1), as the result of the check by the prediction error checking part 141 for the prediction error E=0 of the (n+2)th time (code output step S202), the prediction error code Ce (=0) has been selected as the output code. Thus, the prediction error code Ce (=0) generated in the (n+2)th time is outputted as the output code.

In the (n+4)th time, input data having a data value of 11 is inputted.

The prediction error E in the (n+4)th time is 1 (11−10=1), which is different from the prediction error E=0 of the (n+3)th time. Hence, the run-length R of the prediction error E=0 is determined at 2.

The prediction error encoding part 112 generates a prediction error code Ce (=1) and keeps it in the buffer in the prediction error encoding part 112.

The prediction error checking part 141 checks whether or not the prediction error E=1 coincides with the particular value (code output step S202 in FIG. 3).

If the particular value is 0 (E=0), since the prediction error E=1 is not the particular value, the prediction error checking part 141 selects the prediction error code Ce (=1) as the output code. In the next ((n+5)th) time, the prediction error code Ce (=1) in the buffer is outputted as the output code.

If the particular value is each of +1 and −1 (|E|=1), since the prediction error E=1 is the particular value, the prediction error checking part 141 selects the connected code Cer as the output code. In the next ((n+5)th) time or after the next time, the connected code Cer is outputted as the output code. At this time point, the connected code Cer has not been generated yet.

Since the run-length R of the prediction error E=0 is determined at 2, the run-length counting part 121 outputs the run-length R=2 to the run-length encoding part 122, so as to generate a run-length code Cr.

Furthermore, the prediction error code Ce (=0) of the last time is outputted from the buffer in the prediction error encoding part 112 and connected with the run-length code Cr (=2) by the code connecting part 131, so that a connected code Cer (=(0+2)) is generated.

The run-length R of the new prediction error E=1 becomes 1. At this time point, the run-length R of the new prediction error E=1 has not been determined yet.

If the particular value is 0 (E=0), as the result of the check by the prediction error checking part 141 for the prediction error E=0 of the (n+3)th time (code output step S202), the connected code Cer has been selected as the output code. Thus, the connected code Cer (=(0+2)) generated in the (n+4)th time is outputted as the output code.

If the particular value is each of +1 and −1 (|E|=1), as the result of the check by the prediction error checking part 141 for the prediction error E=0 of the (n+3)th time (code output step S202), the prediction error code Ce (=0) has been selected as the output code. Thus, the prediction error code Ce (=0) generated in the (n+3)th time is outputted as the output code.

In the (n+5)th time, input data having a data value of 13 is inputted.

The prediction error E in the (n+5)th time is 2 (13−11=2), which is different from the prediction error E=1 of the (n+4)th time. Hence, the run-length R of the prediction error E=1 is determined at 1.

The prediction error encoding part 112 generates a prediction error code Ce (=2) and keeps it in the buffer in the prediction error encoding part 112.

The prediction error checking part 141 checks whether or not the prediction error E=2 coincides with the particular value (code output step S202 in FIG. 3).

If the particular value is 0 (E=0), since the prediction error E=2 is not the particular value, the prediction error encoding part 112 selects the prediction error code Ce (=2) as the output code. In the next ((n+6)th) time, the prediction error code Ce (=2) in the buffer is outputted as the output code.

If the particular value is each of +1 and −1 (|E|=1) as well, since the prediction error E=2 is not the particular value, the prediction error encoding part 112 selects the prediction error code Ce (=2) as the output code. In the next ((n+6)th) time, the prediction error code Ce (=2) in the buffer is outputted as the output code.

Since the run-length R of the prediction error E=1 is determined at 1, the run-length counting part 121 outputs the run-length R=1 to the run-length encoding part 122, so as to generate a run-length code Cr.

Furthermore, the prediction error code Ce (=1) of the last time is outputted from the buffer in the prediction error encoding part 112 and connected with the run-length code Cr (=1) by the code connecting part 131, so that a connected code Cer (=(1+1)) is generated.

The run-length R of the new prediction error E=2 becomes 1. At this time point, the run-length R of the new prediction error E=2 has not been determined yet.

If the particular value is 0 (E=0), as the result of the check by the prediction error checking part 141 for the prediction error E=1 of the (n+4)th time (code output step S202), the prediction error code Ce (=1) has been selected as the output code. Thus, the prediction error code Ce (=1) generated in the (n+4)th time is outputted as the output code.

If the particular value is each of +1 and −1 (|E|=1), as the result of the check by the prediction error checking part 141 for the prediction error E=1 of the (n+4)th time (code output step S202), the connected code Cer has been selected as the output code. Thus, the connected code Cer (=(1+1)) generated in the (n+5)th time is outputted as the output code.

In this manner, according to this embodiment, a prediction error for input data is calculated, and the nm-length of the prediction error is counted. Therefore, data that increases or decreases with a constant gradient can also be run-length encoded efficiently.

Also, according to this embodiment, either one of the prediction error code and the connected code is selected as an output code depending on the value of the prediction error. By appropriately setting a prediction error for which a connected code is to be selected, to match the fluctuation characteristics of the data value, the compression efficiency can be increased.

For example, when the data value does not change largely among input data and the prediction error E=0 continues frequently, a connected code Cer is outputted as an output code when prediction error E=0, and a prediction error code Ce is outputted as an output code otherwise. This can enhance the compressibility.

Alternatively, with data that increases or decreases moderately at a constant rate, the prediction error |E|=1 continues frequently. In this case, a connected code Cer is outputted as an output code when prediction error |E|=1, and a prediction error code Ce is outputted as an output code otherwise. This can enhance the compressibility.

In the above description, the run-length counting part 121 counts the run-length for every prediction error. Alternatively, the run-length counting part 121 may count the run-length for the prediction error having the particular value.

In other words, when the value of the prediction error calculated by the prediction error calculation part 111 is the particular value (the particular value treated as the check target in S202 of FIG. 3), the prediction error checking part 141 instructs the run-length counting part 121 to start counting the run-length of the prediction error.

The run-length counting part 121 starts counting the run-length of the prediction error instructed by the prediction error checking part 141.

Then, the processes of the run-length counting part 121 and run-length encoding part 122 can be performed efficiently.

Figure 10:
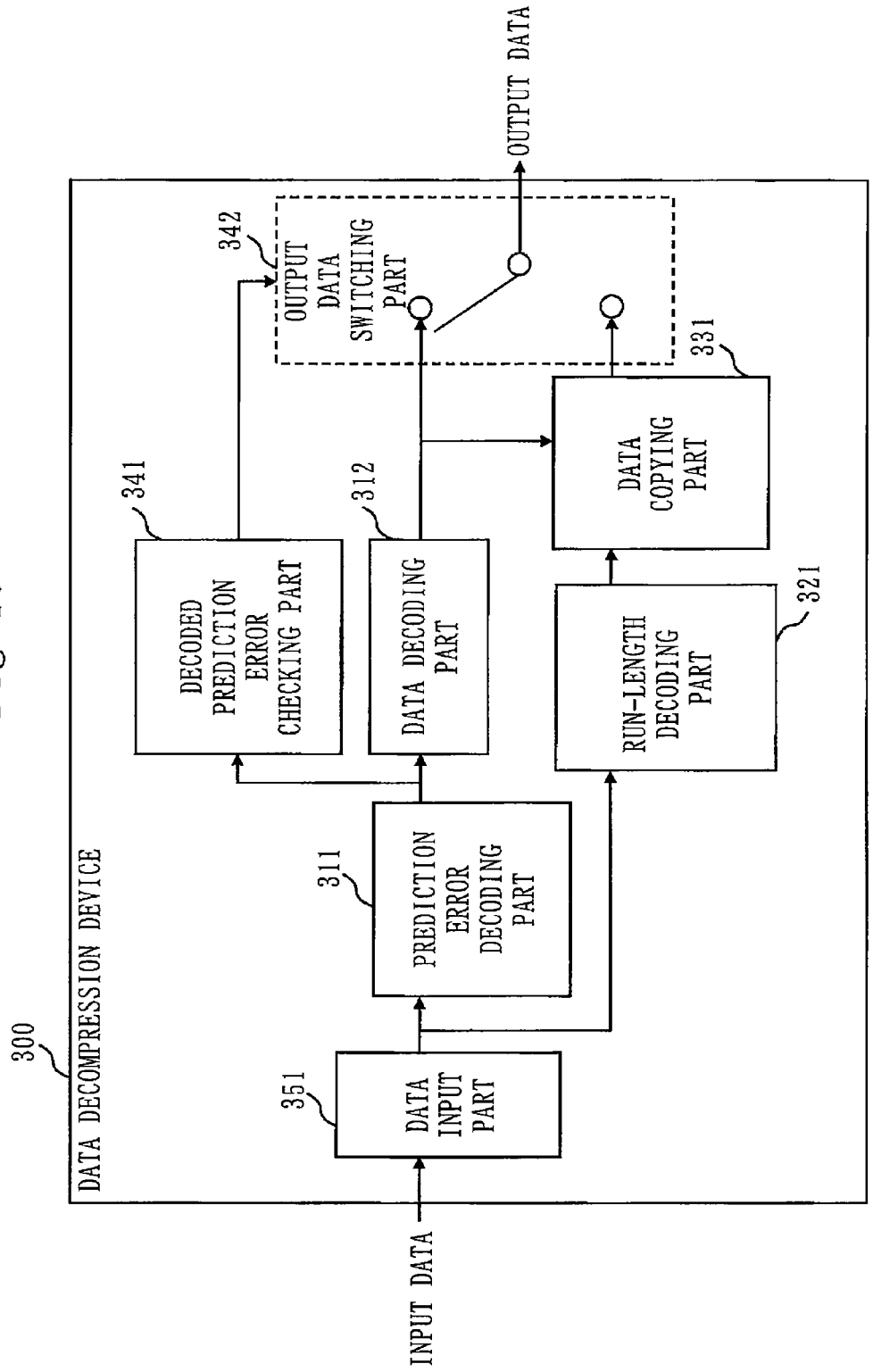
FIG. 10 is a block diagram showing a configuration of a data decompression device according to Embodiment 1.

FIG. 10 is a diagram showing a configuration of the function block of a data decompression device 300 according to this embodiment.

The data decompression device 300 sequentially inputs the post-compression data compressed by the data compression device 100, decompresses the input data, and outputs data restored to the pre-compression state. The post-compression data compressed by the data compression device 100 includes output data (encoded data) of the data compression device 100, the number of units of processing of the output data, and the number of codes included in the output data. The post-compression data may further include data obtained by encoding the particular value used by the prediction error checking part 141 of the data compression device 100. In this case, the structure of the post-compression data should have a header including the number of units of processing of the output data, the number of codes included in the output data, and the data obtained by encoding the particular value; and the compressed output data immediately after the header. The particular value need not be included in the post-compression data, but the data compression device 100 and the data decompression device 300 may have a common particular value fixedly, or a common particular value may be preset in the data compression device 100 and the data decompression device 300.

The data decompression device 300 includes a prediction error decoding part 311, a data decoding part 312, a run-length decoding part 321, a data copying part 331, a decoded prediction error checking part 341, an output data switching part 342, and a data input part 351.

The data input part 351 inputs the input data in a predetermined unit of processing (for example, 32 bits), and extracts a code included in the unit of processing. If the code is smaller than the unit of processing, the data input part 351 extracts a plurality of codes sequentially from one unit of processing. If the code is larger than the unit of processing or the code is across the plurality of units of processing, the data input part 351 inputs the input data sequentially and extracts the code. In other words, the data input part 351 performs an operation reverse to that of the code output part 151 in the data compression device 100. The code can be extracted in this manner because the bit length of the code is uniquely determined by examining the code bits sequentially starting with the MSB in accordance with the variable-length encoding method which uses the gamma code, the delta code, or the like.

The number of codes included in the output data is inputted from the header in advance, and the number of codes extracted is counted. When the number of codes counted coincides with the number of codes included in the output data, this indicates that the data is the final data, and data input can be ended.

Also, the number of units of processing included in the output data is inputted from the header in advance, and the number of inputted units of processing of the encoded data is counted. When data input is ended, it is confirmed that the number of units of processing included in the output data and the number of inputted units of processing of the encoded data coincide with each other. In this manner, data consistency can be confirmed.

The prediction error decoding part 311 decodes the prediction error E from the code extracted by the data input part 351. For decoding, a decoding method that matches the prediction error encoding part 112 of the data compression device 100 is employed. More specifically, if the prediction error encoding part 112 uses the gamma code, the prediction error decoding part 311 will also use the gamma code. Inverse transform of mapping to a positive integer is further performed, so that the prediction error E can be decoded.

Using the record of the data that has been decoded in the past, the data decoding part 312 calculates the difference between the prediction error E and the prediction value obtained by predicting the current data, thereby decoding the original data. The prediction value is calculated by the same method as that of the prediction error calculation part 111.

The decoded prediction error checking part 341 controls the output data switching part 342 depending on the value of the prediction error E, to determine which one is to be selected as a corresponding output code, between data obtained by decoding the prediction error code Ce and data obtained by decoding the connected code Cer. The decoded prediction error checking part 341 inputs an encoded value of the particular value from the header in advance and decodes the particular value. Alternatively, the decoded prediction error checking part 341 compares the prediction error E with a fixed particular value or a preset particular value. If the prediction error E is not the particular value, the decoded prediction error checking part 341 determines that the inputted code is Ce, and causes the output data switching part 342 to output the data decoded by the data decoding part 312, as the output data.

If the prediction error E is the particular value, it is determined that the inputted code is a prediction error code included in the connected code Cer. In this case, the run-length decoding part 321 inputs the next code extracted by the data input part 351, and decodes the run-length. For decoding, a decoding method that matches the run-length encoding part 122 of the data compression device 100 is employed. More specifically, if the run-length encoding part 122 uses the gamma code, the run-length decoding part 321 will also use the gamma code.

If the prediction error E is the particular value, furthermore, the data copying part 331 copies the data by outputting the data decoded by the data decoding part 312, repeatedly for a duration corresponding to the run-length. At this time, the decoded prediction error checking part 341 causes the output data switching part 342 to output the output of the data copying part 331, as the output data.

The operation of the data decompression device 300 will now be described.

Figure 11:
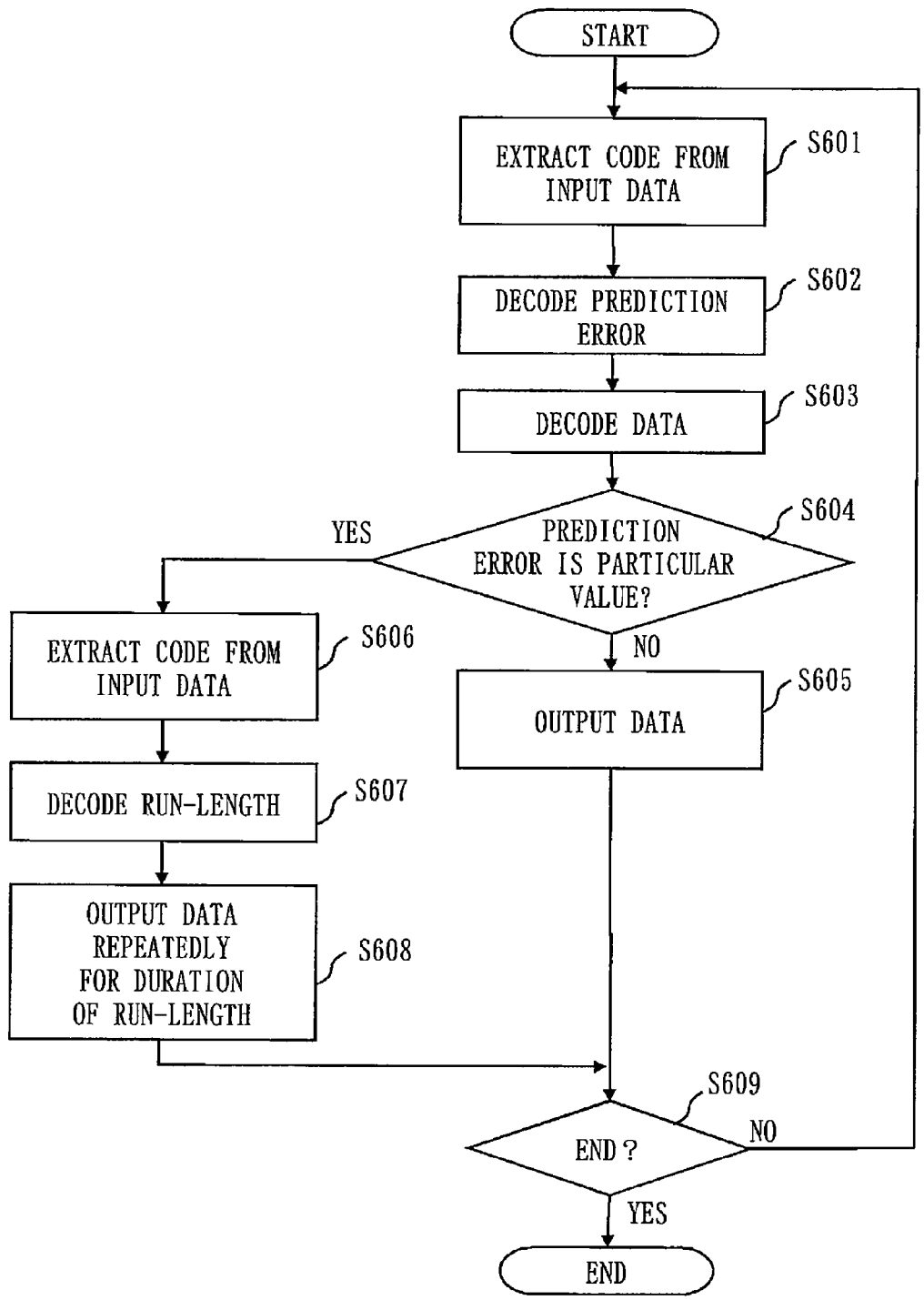
FIG. 11 is a flowchart showing an operation example of the data decompression device according to Embodiment 1.

FIG. 11 is a flowchart showing an example of the flow of the decompression process of the data decompression device 300 according to this embodiment.

In decompression step S601, the data input part 351 inputs the input data in a predetermined unit of processing, and extracts a code included in the unit of processing. The data input part counts the number of inputted units of processing and the number of extracted codes.

In decompression step S602, the prediction error decoding part 311 decodes an extracted code by using the gamma code, the delta code, or another code, to generate the prediction error E.

In decompression step S603, by using the prediction error E and the record data decoded in the past, the data decoding part 312 decodes the current data.

In decompression step S604, the decoded prediction error checking part 341 checks whether or not the prediction error E is the particular value.

If the prediction error E does not coincide with the particular value in decompression step S604, the decoded prediction error checking part 341 causes the output data switching part 342 to select outputting the current decoded data in decompression step S605.

Next, if the prediction error E coincides with the particular value in decompression step S604, the data input part 351 extracts the next code in decompression step S606. The data input part counts the number of inputted units of processing and the number of extracted codes.

In decompression step S607, the run-length decoding part 321 decodes the extracted code using the gamma code, the delta code, or another code, to generate the run-length R.

In decompression step S608, the data copying part 331 outputs the current data decoded by the data decoding part 312, repeatedly a number of times corresponding to the run-length R. At this time, the decoded prediction error checking part 341 causes the output data switching part 342 to select outputting the output data of the data copying part 331.

In decompression step S609, if the number of codes counted by the data input part 351 is equal to the number of codes inputted from the header of the post-compression data, data decompression is ended; otherwise, the flow returns to decompression step S601.

As has been described above, according to this embodiment, post-compression data can be decompressed by checking whether or not the next code is the next prediction error code or the run-length code of the connected code, based on the value of the decoded prediction error.

So far, this embodiment has explained a data compression device which compresses an input data sequence, the data compression device including:

means for calculating a prediction error which is a difference between data concerned and a prediction value calculated using the record of at least one piece of input data;

means for generating a prediction error code by encoding the prediction error using a variable-length code;

means for counting the run-length of the prediction error;

means for generating a run-length code by encoding the run-length using a variable-length code; and means for generating an output code out of the prediction error code and the run-length code, wherein the means for generating the output code selects whether to treat the prediction error code as an output code, or to connect the prediction error code and the run-length code, as an output code, depending on the value of the prediction error.

Also, this embodiment has explained that the means for generating the output code treats the prediction error code as the output code when the absolute value of the prediction error is larger than a threshold, and connects the prediction error code and a run-length code, as the output code when the absolute value of the prediction error is equal to or smaller than the threshold.

Also, this embodiment has explained that the means for generating the prediction error code by encoding the prediction error using a variable-length code includes means for transforming the prediction error into a nearest integer having a fixed bit count, means for encoding a corresponding fixed bit string as an output code when the transformed integer value is a minimum value expressed by the fixed bit count, and means for variable-length encoding the transformed integer value by mapping the transformed integer value to a positive integer when the transformed integer value is not the minimum value.

Also, this embodiment has explained that the means for variable-length encoding performs encoding by using the unary code, the gamma code, the delta code, the omega code, or the Golomb code.

Also, this embodiment has explained that the means for generating the run-length code by encoding the run-length using a variable-length code encodes the run-length by using the unary code, the gamma code, the delta code, the omega code, or the Golomb code.

Also, this embodiment has explained that the prediction value is data immediately before the data concerned.

Also, this embodiment has explained that the prediction value is linear computation of a fixed parameter using at least two pieces of immediately preceding data.

Embodiment 2

Figure 4:
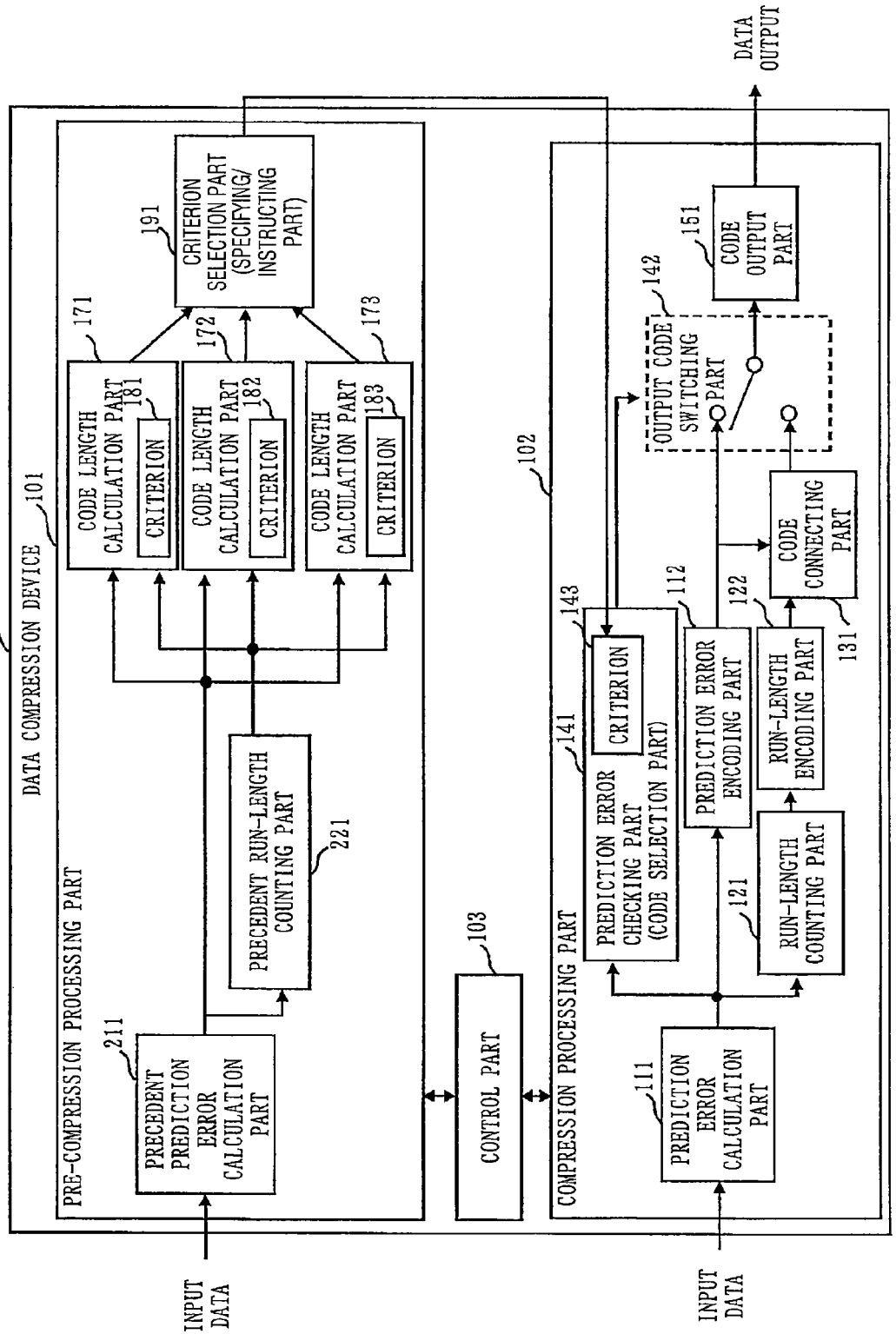
FIG. 4 is a diagram showing a configuration of a data compression device according to Embodiment 2.

FIG. 4 is a diagram showing a configuration of the function block of a data compression device 200 according to this embodiment.

The data compression device 200 is separated into a pre-compression processing part 101, a compression processing part 102, and a control part 103.

The compression processing part 102 has substantially the same structure as that of the data compression device 100 described in Embodiment 1, but is different from Embodiment 1 in that a prediction error checking part 141 stores a code selection criterion 143.

The pre-compression processing part 101 has a precedent prediction error calculation part 211, a precedent run-length counting part 221, code length calculation parts 171, 172, and 173, code length calculation criteria 181, 182, and 183, and a criterion selection part 191.

The internal structure of the pre-compression processing part 101 will be described later in detail.

The data compression device 200 according to this embodiment optimizes the criterion for code selection by processing input data in 2 passes.

The control part 103 performs pass management of compression process. The control part 103 causes the pre-compression processing part 101 to input the input data in the first pass, to calculate the post-compression code lengths based on a plurality of criteria, and to select a criterion with which the code length is the shortest.

The pre-compression processing part 101 selects, among a plurality of code selection criteria, a code selection criterion with which the post-compression code length is the shortest. Hence, if the characteristics of the input data change with time, the code selection criterion to be selected may change as the characteristics of the input data change.

If the post-compression code length based on the selected criterion is less than a target compression block size, the control part 103 inputs additional input data to the pre-compression processing part 101 so that the post-compression code length is updated.

If the post-compression code length exceeds the target compression block size, in the second pass, the control part 103 inputs a series of input data which precede the last additional input data to the compression processing part 102, and causes the compression processing part 102 to perform the compression process.

The pre-compression processing part 101 will be described in detail.

The precedent prediction error calculation part 211 and precedent run-length counting part 221 of the pre-compression processing part 101 are the same, in terms of the function, as the prediction error calculation part 111 and run-length counting part 121 described in Embodiment 1, but are different in the following respects.

In this embodiment, before the prediction error calculation part 111 of the compression processing part 102 inputs data, the precedent prediction error calculation part 211 inputs data that the prediction error calculation part 111 is to input (also called to-be-inputted data), predicts the data value in accordance with the same method as that of the prediction error calculation part 111, and calculates a prediction error for each to-be-inputted data.

The precedent run-length counting part 221 counts the run-length of the prediction error calculated by the precedent prediction error calculation part 211.

The code length calculation parts 171, 172, and 173 calculate the code lengths of the prediction error E and variable run-length R as they are variable-length encoded.

Although three code length calculation parts are provided in FIG. 4, the number of code length calculation parts can be arbitrary.

For example, in gamma encoding, with respect to a bit count Ne of a binary number which expresses the prediction error E after transformation by a transformation equation M1 or M2, the code length calculation parts 171, 172, and 173 can calculate a code length Ge in the following manner:

$$Ge = 2Ne - 1$$

When a prediction error E satisfies E=Emin, Ge may be a code length corresponding to Emin.

With respect to a bit count Nr of a binary number which expresses a run-length R, the code length calculation parts 171, 172, and 173 can calculate a code length Gr in the following manner:

$$Gr=2Nr-1$$

Also, the code length calculation parts 171, 172, and 173 can calculate a code length G for the prediction error E and the run-length R in the following manner:

$$G=Ge+Gr$$

for the case where the output code is a connection of a prediction error code and a run-length code; and $$G=Ge\times R$$

for the case where the output code is a prediction error code only.

When a fixed encoding method such as the gamma code is employed, a table of symbol appearance frequency which is required of an entropy code such as arithmetic coding or Huffman coding is unnecessary. The computation amount is thus decreased, and a high-speed process becomes possible. This is the same as described in Embodiment 1.

Furthermore, as described above, in order to adjust the compression block size, the post-compression code length is calculated after the input data being increased gradually increased through adding the input data. In this case, when using the encoding method that requires a table of symbol appearance frequency, the content of the table changes, and a code length that has already been computed need be recomputed. In contrast to this, in the present embodiment, the code length can be calculated fixedly, so only the code length of the additional data need be computed. As a result, the computation amount is decreased, and a high-speed process becomes possible.

Note that the encoding method used in this embodiment is not limited to one that uses the gamma code or delta code, but another integer encoding method which uses the unary code, the omega code, the Golomb code, or the Rice code may be employed instead.

Also, an encoding method which uses the arithmetic code, the Range Coder, the Huffman code, the Shannon code, or another fixed table may be employed.

The code length calculation parts 171, 172, and 173 calculate the code lengths based on the code length calculation criteria 181, 182, and 183.

For example, assume that the code length calculation criterion 181 has:

criterion 1=no run-length encoding (the code length of a prediction error code is always calculated regardless of the value of the prediction error)

Then, the code length calculation part 171 calculates a code length G1 in accordance with the following formula:

$$G1=Ge\times R$$

Assume that the code length calculation criterion 182 has:

criterion 2=run-length encoding only when the prediction error E is 0

Then, the code length calculation part 172 calculates a code length G2 in accordance with the following formulae:

$$G2=Ge+Gr\ldots \text{when } E=0$$

$$G2=Ge\times R\ldots \text{when } E\neq 0$$

Assume that the code length calculation criterion 183 has:
criterion 3=run-length encoding only when the absolute value of the prediction error E is equal to or smaller than 1

Then, the code length calculation part 173 calculates a code length G3 in accordance with the following formulae:

$$G3=Ge+Gr\ldots \text{when } |E|\leq 1$$

$$G3=Ge\times R\ldots \text{when } |E|>1$$

Calculation examples of the code length calculation parts have been indicated above. To a person skilled in the art, use of a criterion other than those indicated above is also obvious.

The code length calculation part calculates a total code length by totaling the code lengths of all to-be-inputted data.

With additional to-be-inputted data, the total code length of the last time is inputted or kept in the code length calculation part, and the code length of the additional to-be-inputted data is added to the total code length of the last time.

In this manner, according to this embodiment, predetermined values are set in the code length calculation parts 171, 172, and 173, respectively, as connected code length calculation values used for calculating the code lengths of the connected codes.

If the value of the prediction error calculated by the precedent prediction error calculation part 211 coincides with a connected code length calculation value, each of the code length calculation parts 171, 172, and 173 calculates the code length of the connected code based on the value of the prediction error and the run-length by the precedent run-length counting part 221. If the value of the prediction error calculated by the precedent prediction error calculation part 211 does not coincide with the connected code length calculation value, each of the code length calculation parts 171, 172, and 173 calculates the code length of the prediction error code based on the value of the prediction error, and calculates the total code length for a plurality of pieces of to-be-inputted data.

More specifically, in the code length calculation part 172, the prediction error E=0 is set as the connected code length calculation value. When the prediction error E=0, the code length calculation part 172 calculates the code length of the connected code. Otherwise, the code length calculation part 172 calculates the code length of the prediction error code. Then, the code length calculation part 173 calculates the total code length of the calculated code length of the connected code and the calculated code length of the prediction error code.

In the code length calculation part 171, the prediction error $|E|\leq 1$ is set as the connected code length calculation value. When the prediction error $|E|\leq 1$, the code length calculation part 173 calculates the code length of the connected code. When the prediction error $|E|>1$, the code length calculation part 172 calculates the code length of the prediction error code. Then, the code length calculation part 173 calculates the total code length of the calculated code length of the connected code and the calculated code length of the prediction error code.

The code length calculation part 171 serves as a special code length calculation part and has no preset connected code length calculation value. With respect to the prediction error calculated by the precedent prediction error calculation part 211, the code length calculation part 173 calculates only the code length of the prediction error code, and calculates the total code length for a plurality of pieces of to-be-inputted data.

The criterion selection part 191 compares the total code lengths calculated by the respective code length calculation parts, and selects a code length calculation criterion with which the code length is the smallest. The criterion selection part 191 then outputs the total code length and a criterion code which indicates the code length calculation criterion.

More specifically, the criterion selection part 191 specifies the connected code length calculation value (E=0, |E|≤1, or the like) of the code length calculation part that satisfies the condition of being the minimum total code length, as the code length calculation criterion. The criterion selection part 191 then instructs the prediction error checking part 141 (code selection part) to select the connected code as an output code for the prediction error having a value specified as the code length calculation criterion.

The criterion selection part 191 is an example of a specifying/instructing part.

The criterion code indicating the code length calculation criterion specified by the criterion selection part 191 is inputted, together with the second-pass input data, to the compression processing part 102 by the control part 103. The criterion code is decoded by the prediction error checking part 141. The prediction error checking part 141 holds the selected code length calculation criterion, as the code selection criterion 143.

Based on the code selection criterion 143, the prediction error checking part 141 selects the connected code for the target prediction error, and executes data compression.

By keeping the criterion code, together with the number of units of processing of the output data, the number of codes included in the output data, and the like described above, as the header of the compression block, in decompression, decoding can be performed by using the same criterion.

As described above, according to this embodiment, in a method in which the prediction error code and the run-length code are adaptably combined depending on the prediction error, the criterion in combination can be optimized for each compression block depending on the input data, so that the compression efficiency can be further enhanced.

The operation of the data compression device 200 will now be described.

Figure 5:
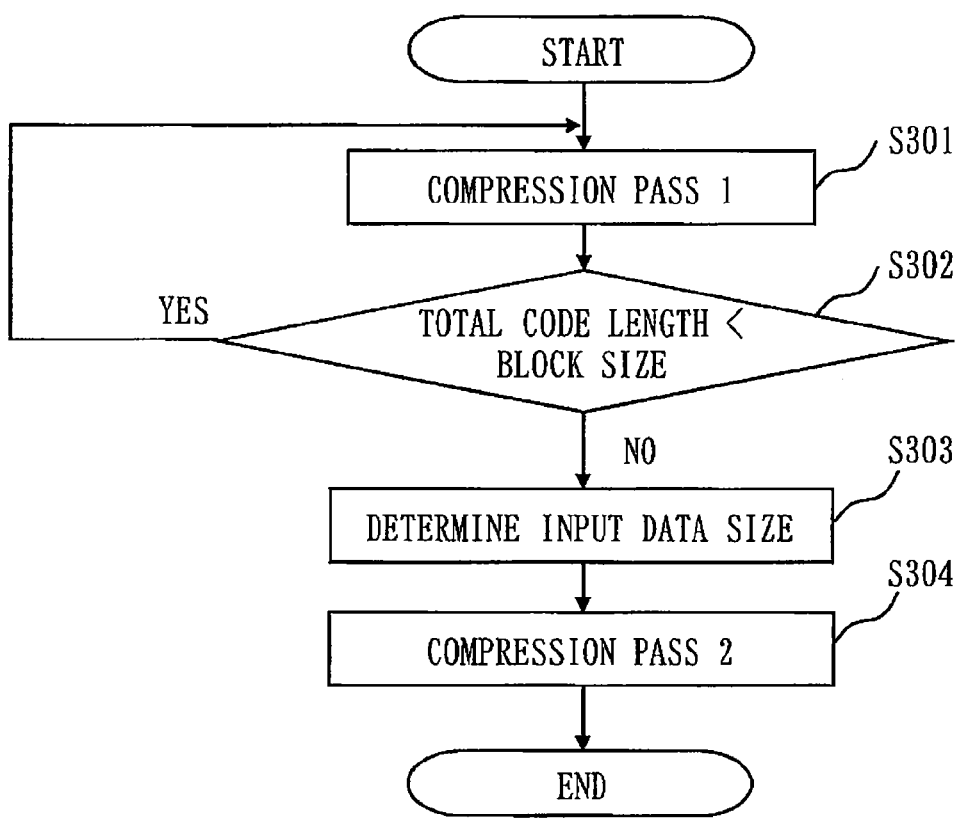
FIG. 5 is a flowchart showing an operation example of the data compression device according to Embodiment 2.

FIG. 5 is a flowchart showing an example of the flow of the compression process of the data compression device 200 according to this embodiment.

In compression step S301, the control part 103 executes a compression pass 1 for to-be-inputted data having a predetermined size. In compression step S302, if the total code length is smaller than a block size, the control part 103 adds another to-be-inputted data and executes the compression pass 1 of 5301.

If the total code length is equal to or larger than the block size, in compression step S303, the control part 103 determines an input data size with which the total code length becomes equal to or smaller than the block size, and in compression step S304, executes the compression pass 2.

Figure 6:
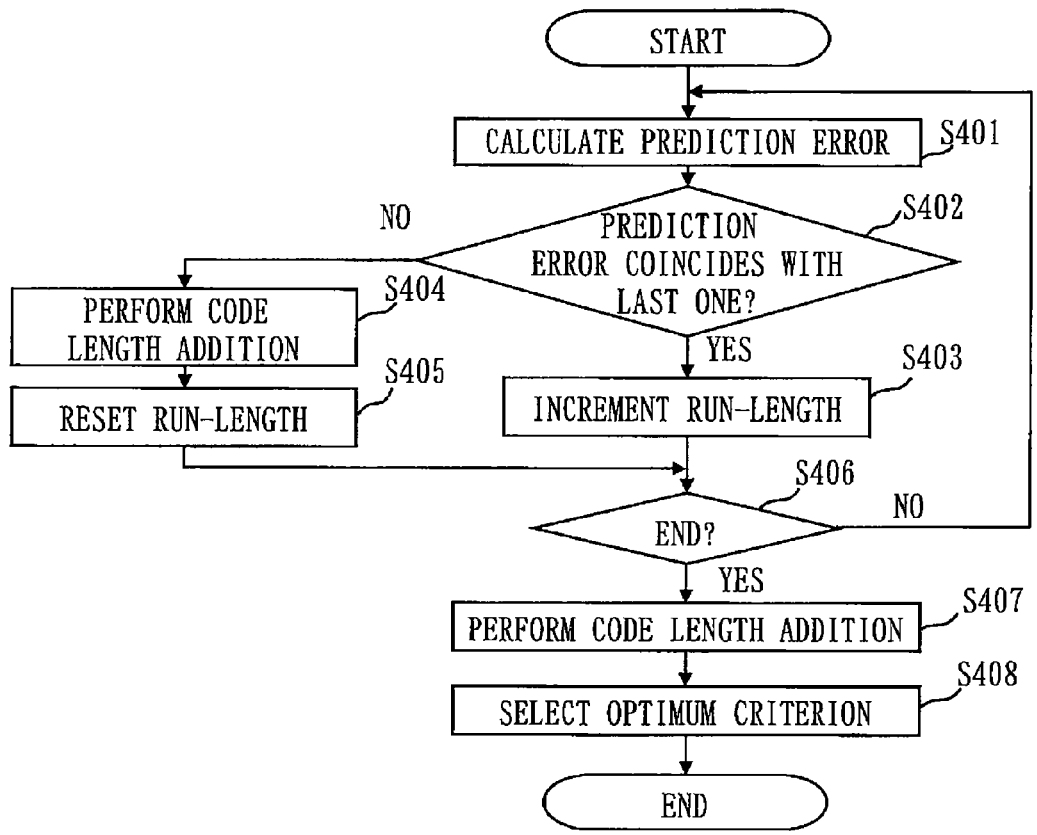
FIG. 6 is a flowchart showing an operation example of the data compression device according to Embodiment 2.

FIG. 6 is a flowchart showing an example of the flow of the compression pass 1 process of the data compression device 200 according to this embodiment.

In compression pass 1 step S401, the precedent prediction error calculation part 211 calculates a prediction error Ec by using the input data and the past record data.

In compression pass 1 step S402, the precedent prediction error calculation part 211 checks whether or not the prediction error Ec coincides with the prediction error Ep of the last time. If they coincide, the precedent run-length counting part 221 increments a variable run-length R by 1 in compression pass 1 step S403.

If they do not coincide, each code length calculation part performs code length addition in compression pass 1 step S404 based on the prediction error Ep and the run-length R. In compression pass 1 step S405, the precedent run-length counting part 221 resets the variable run-length to 1.

In compression pass 1 step S406, whether or not the input data is ended is checked. If data input is not ended yet, the flow returns to compression pass 1 step S401.

If data input is ended, each code length calculation part performs final code length addition in compression pass 1 step S407 based on the prediction error Ec and the run-length R.

In compression pass 1 step S408, the criterion selection part 191 compares the total code lengths calculated for the respective code length calculation criteria, and selects a code length calculation criterion with which the total code length is the minimum. Then, the criterion selection part 191 outputs a criterion code and the total code length.

Figure 7:
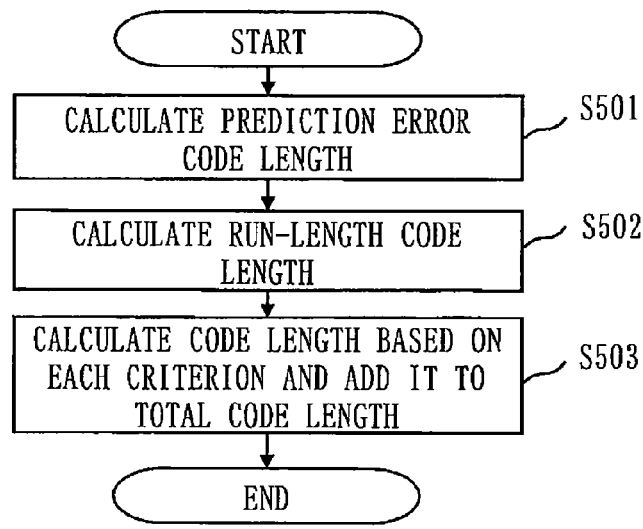
FIG. 7 is a flowchart showing an operation example of the data compression device according to Embodiment 2.

FIG. 7 is a flowchart showing an example of the flow of the code length addition process of the data compression device 200 according to this embodiment.

Each code length calculation part calculates the code length of the prediction error in code length addition step S501, and calculates the code length of the run-length in code length addition step S502. In code length addition step S503, each code length calculation part calculates the code length for the corresponding code length calculation criterion, and adds it to the total code length.

The compression pass 2 process of the data compression device 200 according to this embodiment is the same as those shown in FIGS. 2 and 3 except that whether or not the prediction error is the particular value is checked in S202 of FIG. 3 based on the criterion selected in the compression pass 1 process.

In this manner, according to this embodiment, the optimum code length calculation criterion can be selected for each compression block depending on the characteristics of the input data. Thus, the compression efficiency can be further enhanced.

This embodiment has explained that the data compression device further includes means for calculating the code length of the prediction error code, means for calculating the code length of the run-length code, means for selecting the code length of the prediction error code or the code length of the code obtained by connecting the prediction error code and the run-length code, based on the plurality of criteria that match the values of the prediction error, and calculating the code lengths of the plurality of output code sequences corresponding to the plurality of criteria, means for calculating the code lengths of the plurality of output code sequences for the input data block and selecting a criterion with which the code length is the minimum, as the criterion of the input data block, means for calculating, when input data is added to the input data block, the plurality of code lengths of the added input data, adding the calculated plurality of code lengths to the code length calculated before the input data is added, and re-selecting the criterion with which the code length is the minimum, and means for generating the output code sequence of the input data block based on the selected criterion.

Also, this embodiment has explained that the plurality of criteria include at least one of the criterion with which the prediction error code is treated as the output code regardless of the prediction error, the criterion with which, when the prediction error is 0, the prediction error code and the run-length code are connected and the resultant code is treated as the output code, and otherwise the prediction error code is treated as the output code, and the criterion with which, when the absolute value of the prediction error is equal to or smaller than 1, the prediction error code and the run-length code are connected and the resultant code is treated as the output code, and otherwise the prediction error code is treated as the output code.

Finally, a hardware configuration example of each of the data compression devices 100 and 200 respectively shown in Embodiments 1 and 2 will be described.

Figure 9:
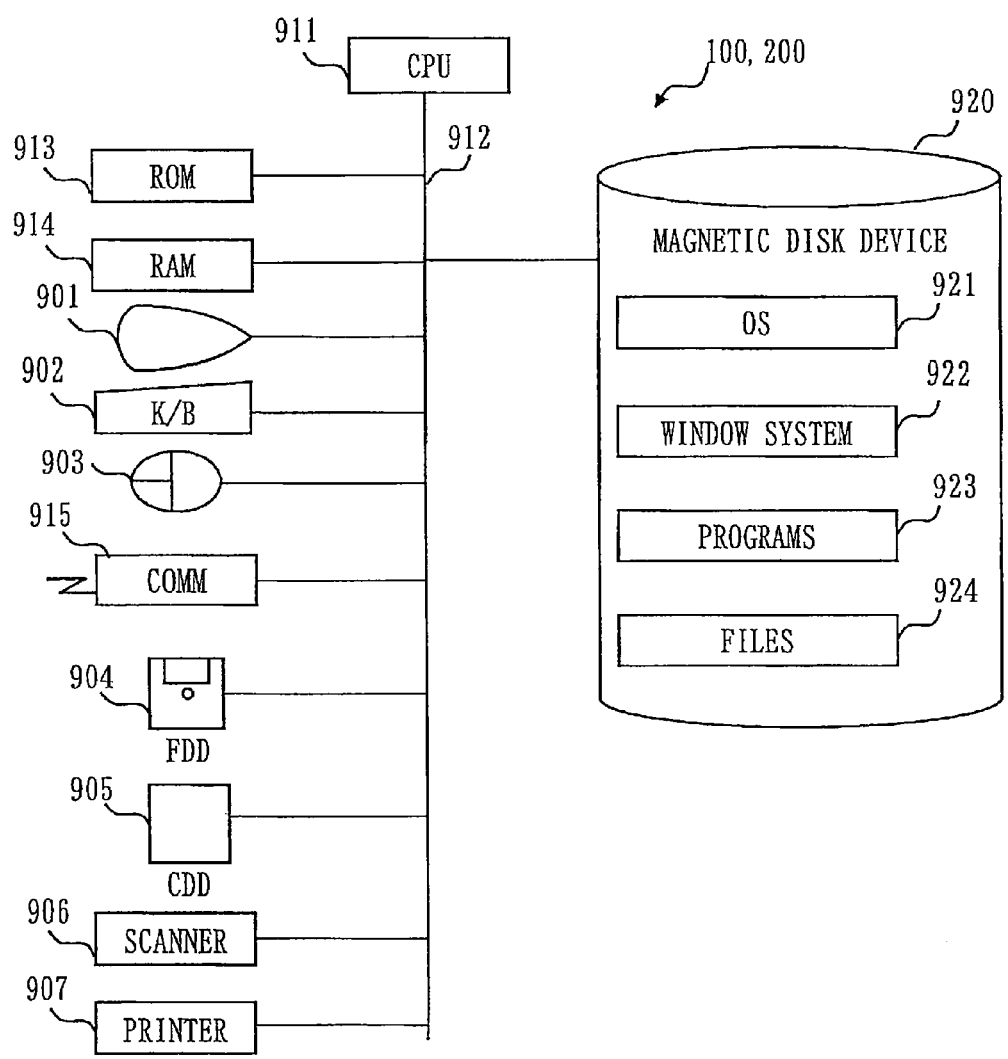
FIG. 9 is a diagram showing a hardware configuration of the data compression devices according to Embodiments 1 and 2.

FIG. 9 shows an example of the hardware resource of each of the data compression devices 100 and 200 respectively shown in Embodiments 1 and 2.

Note that the configuration of FIG. 9 is merely an example of the hardware configuration of the data compression devices 100 and 200. The hardware configuration of the data compression devices 100 and 200 is not limited to that shown in FIG. 9, but another configuration may also be possible.

Referring to FIG. 9, each of the data compression devices 100 and 200 includes a CPU 911 (also referred to as a Central Processing Unit, central processing device, processing device, computation device, microprocessor, microcomputer, or processor) that executes programs.

The CPU 911 is connected to, for example, a ROM (Read Only Memory) 913, a RAM (Random Access Memory) 914, a communication board 915, a display device 901, a keyboard 902, a mouse 903, and a magnetic disk device 920 via a bus 912, and controls these hardware devices.

Furthermore, the CPU 911 may be connected to an FDD 904 (Flexible Disk Drive), a compact disk device 905 (CDD), a printer device 906, or a scanner device 907. In place of the magnetic disk device 920, a storage device such as an optical disk device or memory card (registered trademark) read/write device may be employed.

The RAM 914 is an example of a volatile memory. The storage media, namely the ROM 913, FDD 904, CDD 905, and magnetic disk device 920, are examples of a nonvolatile memory. These devices are examples of the storage device.

The communication board 915, keyboard 902, mouse 903, scanner device 907, FDD 904, and the like are examples of an input device.

The communication board 915, display device 901, printer device 906, and the like are examples of an output device.

The communication board 915 is connected to, for example, a LAN (Local Area Network), the Internet, a WAN (Wide Area Network), or a SAN (Storage Area Network).

The magnetic disk device 920 stores an operating system 921 (OS), a window system 922, programs 923, and files 924.

The CPU 911 executes each program of the programs 923 by utilizing the operating system 921 and the window system 922.

The RAM 914 temporarily stores at least some programs of the operating system 921 and application programs that are executed by the CPU 911.

The RAM 914 also stores various types of data necessary for the process performed by the CPU 911.

The ROM 913 stores the BIOS (Basic Input Output System) program. The magnetic disk device 920 stores the boot program.

When booting the data compression device 100 or 200, the BIOS program of the ROM 913 and the boot program of the magnetic disk device 920 are executed, and the BIOS program and boot program boot the operating system 921.

The programs 923 include a program that executes the function described as a "part" or "means" in Embodiments 1 and 2. The program is read and executed by the CPU 911.

The files 924 store information, data, signal values, variable values, and parameters indicating the results of the processes described as "determining", "checking", "encoding", "generating", "counting", "comparing", "evaluating", "setting", "selecting", "specifying" and the like in Embodiments 1 and 2, as the items of "files" and "databases".

The "files" and "databases" are stored in a recording medium such as a disk or memory. The information, data, signal values, variable values, and parameters stored in the storage medium such as the disk or memory are read out to the main memory or cache memory by the CPU 911 through a read/write circuit, and are used for the operations of the CPU such as extraction, search, look-up, comparison, computation, calculation, process, edit, output, print, and display.

During the operations of the CPU including extraction, search, look-up, comparison, computation, calculation, process, edit, output, print, and display, the information, data, signal values, variable values, and parameters are temporarily stored in the main memory, register, cache memory, buffer memory, or the like.

The arrows in the flowcharts described in Embodiments 1 and 2 mainly indicate input/output of data and signals. The data and signal values are stored in a recording medium such as: the memory of the RAM 914, the flexible disk of the FDD 904, the compact disk of the CDD 905, or the magnetic disk of the magnetic disk device 920; or an optical disk, mini disk, or DVD. The data and signals are transmitted online via the bus 912, a signal line, a cable, or another transmission medium.

The "part" and "means" in Embodiments 1 and 2 may be a "circuit", "device", or "equipment"; or a "step", "procedure", or "process".

Namely, the steps, procedures, and processes shown in the flowcharts described in Embodiments 1 and 2 can implement the "data compression method" according to the present invention.

The "part" and "means" may be implemented as the firmware stored in the ROM 913. Alternatively, the "part" and "means" may be practiced by only software; by only hardware such as an element, a device, a substrate, or a wiring line; by a combination of software and hardware; or furthermore by a combination of software, hardware, and firmware. The firmware and software are stored, as programs, in a recording medium such as a magnetic disk, flexible disk, optical disk, compact disk, mini disk, or DVD. The program is read by the CPU 911 and executed by the CPU 911. In other words, the program causes the computer to function as the "part" and "means" in Embodiments 1 and 2. Alternatively, the program causes the computer to execute the procedure and method of the "part" and "means" in Embodiments 1 and 2.

In this manner, data compression devices 100 and 200 indicated in Embodiments 1 and 2 are respectively computers each comprising a CPU being a processing device; a memory, magnetic disk, and the like each being a storage device; a keyboard, mouse, communication board, and the like each being an input device; and a display device, communication board, and the like each being an output device. The functions expressed as the "parts" and "means" are implemented by using these processing device, storage device, input device, and output device.

REFERENCE SIGNS LIST

100: data compression device; 101: pre-compression processing part; 102: compression processing part; 103: control part; 111: prediction error calculation part; 112: prediction error encoding part; 121: run-length counting part; 122: run-length encoding part; 131: code connecting part; 141: prediction error checking part; 142: output code switching part; 143: code selection criterion; 151: code output part; 171: code length calculation part; 172: code length calculation part; 173: code length calculation part; 181: code length calculation criterion; 182: code length calculation criterion; 183: code length calculation criterion; 191: criterion selection part; 200: data compression device; 211: precedent prediction error calculation part; 221: precedent run-length counting part; 300: data decompression device; 311: prediction error decoding part; 312: data decoding part; 321: run-length decoding part; 331: data copying part; 341: decoded prediction error checking part; 342: output data switching part; 351: data input part

The invention claimed is:

1. A data compression device which sequentially inputs data, comprising:
 a prediction error calculation part which predicts a value of data before inputting the data, and each time the data is inputted, calculates a difference between a value of the input data which is inputted and a prediction value which is predicted for the input data, as a prediction error;
 a prediction error encoding part which encodes a value of the prediction error calculated and generates a prediction error code, each time the prediction error is calculated by the prediction error calculation part;
 a run-length counting part which counts a run-length of the prediction error calculated by the prediction error calculation part;
 a run-length encoding part which encodes the run-length counted by the run-length counting part and generates a run-length code, when the value of the prediction error changes;
 a code connecting part which connects the run-length code generated, to a prediction error code of a prediction error corresponding to the run-length code and generates a connected code, each time the run-length code is generated by the run-length encoding part;
 a code selection part which selects, via a processor, either one of the prediction error code for the prediction error and the connected code, as an output code, depending on the value of the prediction error calculated by the prediction error calculation part; and
 a specifying/instructing part which, prior to data input by the prediction error calculation part, specifies a particular value for a plurality of pieces of to-be-inputted data which are to be inputted by the prediction error calculation part, and instructs the code selection part to select the connected code as the output code for the prediction error of the value specified;
 wherein the code selection part
 selects the connected code for the prediction error, as the output code when the value of the prediction error calculated by the prediction error calculation part is the value instructed by the specifying/instructing part, and selects the prediction error code for the prediction error, as the output code when the value of the prediction error calculated by the prediction error calculation part is a different value.

2. The data compression device according to claim 1, wherein, when the value of the prediction error calculated by the prediction error calculation part is the value instructed by the specifying/instructing part, the code selection part instructs the run-length counting part to start counting the run-length of the prediction error, and wherein the run-length counting part starts counting the run-length of the prediction error instructed by the code selection part.

3. The data compression device according to claim 1, further comprising:
 a precedent prediction error calculation part which, prior to data input by the prediction error calculation part, predicts a data value for each to-be-inputted data in accordance with the same method as a prediction method of the prediction error calculation part, and calculates a prediction error for each to-be-inputted data;
 a precedent run-length counting part which counts a run-length of the prediction error calculated by the precedent prediction error calculation part; and
 a code length calculation part in which a predetermined value is set as a connected code length calculation value used for calculating a code length of the connected code, and which calculates the code length of the connected code based on the value of the prediction error and the run-length counted by the precedent run-length counting part when the value of the prediction error calculated by the precedent prediction error calculation part coincides with the connected code length calculation value, and calculates the code length of the prediction error code based on the value of the prediction error when the value of the prediction error calculated by the precedent prediction error calculation part does not coincide with the connected code length calculation value, thereby calculating a total code length of the plurality of pieces of to-be-inputted data;
 wherein, when the total code length calculated by the code length calculation part satisfies a predetermined condition, the specifying/instructing part specifies the connected code length calculation value, as a value with which the code selection part selects the connected code.

4. The data compression device according to claim 3, further comprising:
 a plurality of code length calculation parts in which different values are respectively preset as connected code length calculation values, and each of which calculates either one of the code length of the connected code and the code length of the prediction error code for each prediction error, based on a corresponding connected code length calculation value, thereby calculating the total code length of the plurality of pieces of to-be-inputted data;
 wherein the specifying/instructing part
 specifies the connected code length calculation value of the code length calculation part of a minimum total code length, as a value with which the code selection part selects the connected code.

5. The data compression device according to claim 4, further comprising at least either one of:
 a code length calculation part in which a value of 0 is set as the connected code length calculation value, and which calculates the code length of the connected code when the value of the prediction error calculated by the precedent prediction error calculation part is 0, and calculates the code length of the prediction error code when the value of the prediction error calculated by the precedent prediction error calculation part is not 0; and
 a code length calculation part in which an absolute value of not larger than 1 is set as the connected code length calculation value, and which calculates the code length of the connected code when the absolute value of the prediction error calculated by the precedent prediction error calculation part is not larger than 1, and calculates the code length of the prediction error code when the absolute value of the prediction error calculated by the precedent prediction error calculation part is larger than 1.

6. The data compression device according to claim 3, further comprising:

a special code length calculation part in which no connected code length calculation value is set, and which calculates only the code length of the prediction error code for the prediction error calculated by the precedent prediction error calculation part and thereby calculating the total code length of the plurality of pieces of to-be-inputted data;

wherein the specifying/instructing part specifies the connected code length calculation value of the code length calculation part as a value with which the code selection part selects the connected code, when the total code length calculated by the code length calculation part is less than the total code length calculated by the special code length calculation part; and instructs the code selection part to select only the prediction error code as the output code regardless of the value of the prediction error, when the total code length calculated by the code length calculation part is not less than the total code length calculated by the special code length calculation part.

7. The data compression device according to claim 1, wherein the prediction error encoding part generates the prediction error code by encoding the value of the prediction error using a variable-length code, and wherein the run-length encoding part generates the run-length code by encoding the run-length using a valuable-length code.

8. The data compression device according to claim 7, wherein the prediction error encoding part, checks, each time the prediction error is calculated by the prediction error calculation part, whether or not the value of the prediction error calculated is a minimum value among integer values each represented by a predetermined fixed bit count, and when the value of the prediction error is the minimum value, generates the prediction error code by encoding the value of the prediction error using the fixed bit count, and when the value of the prediction error is not the minimum value, generates the prediction error code by mapping the value of the prediction error to a positive integer and encoding the positive integer mapped, using a variable-length code.

9. The data compression device according to claim 1, wherein the prediction error encoding part generates the prediction error code by using one of the unary code, the gamma code, the delta code, the omega code, and the Golomb code, and wherein the run-length encoding part generates the run-length code by using one of the unary code, the gamma code, the delta code, the omega code, and the Golomb code.

10. The data compression device according to claim 1, wherein the prediction error encoding part uses a value of data inputted immediately before the data to be inputted next, as the prediction value of the data to be inputted next.

11. The data compression device according to claim 1, wherein the prediction error encoding part conducts linear computation using not less than two pieces of data that have been inputted prior to the data to be inputted next, and calculates the prediction value of the data to be inputted next.

12. A data compression method conducted by a computer that sequentially inputs data, the method comprising:

predicting a value of data before inputting the data, and each time the data is inputted, calculating a difference between a value of the input data which is inputted and a prediction value which is predicted for the input data, as a prediction error, by the computer;

encoding a value of the prediction error calculated and generating a prediction error code, each time the prediction error is calculated, by the computer;

counting a run-length of the prediction error calculated, by the computer;

encoding the run-length counted and generating a run-length code, when the value of the prediction error changes, by the computer;

connecting the run-length code generated, to a prediction error code of a prediction error corresponding to the run-length code and generating a connected code, each time the run-length code is generated, by the computer; and selecting, via a processor, either one of the prediction error code for the prediction error and the connected code, as an output code, depending on the value of the prediction error calculated, by the computer;

wherein, the computer, prior to data input, specifies a particular value for a plurality of pieces of to-be-inputted data which are to be inputted, and determines to select the connected code as the output code for the prediction error of the value specified, and selects the connected code for the prediction error, as the output code when the value of the prediction error calculated for the input data is the value specified prior to the data input, and selects the prediction error code for the prediction error, as the output code when the value of the prediction error calculated for the input data is a different value.

13. A non-transitory computer readable medium including computer executable instructions causing a computer that sequentially inputs data, to execute a method comprising:

a prediction error calculation process of predicting a value of data before inputting the data, and each time the data is inputted, calculating a difference between a value of the input data which is inputted and a prediction value which is predicted for the input data, as a prediction error;

a prediction error encoding process of encoding a value of the prediction error calculated and generating a prediction error code, each time the prediction error is calculated in the prediction error calculation process;

a run-length counting process of counting a run-length of the prediction error calculated in the prediction error calculation process;

a run-length encoding process of encoding the run-length counted in the run-length counting process and generating a run-length code, when the value of the prediction error changes;

a code connecting process of connecting the run-length code generated, to a prediction error code of a prediction error corresponding to the run-length code and generating a connected code, each time the run-length code is generated in the run-length encoding process;

a code selection process of selecting either one of the prediction error code for the prediction error and the connected code, as an output code, depending on the value of the prediction error calculated in the prediction error calculation process; and a specifying/instructing process of, prior to data input by the prediction error calculation process, specifying a particular value for a plurality of pieces of to-be-inputted data which are to be inputted in the prediction error calculation process, and instructing the code selection process to select the connected code as the output code for the prediction error of the value specified;

wherein the code selection process causes the computer to select the connected code for the prediction error, as the output code when the value of the prediction error calculated in the prediction error calculation process is the value instructed by the specifying/instructing process, and to select the prediction error code for the prediction error, as the output code when the value of the prediction error calculated in the prediction error calculation process is a different value.

\* \* \* \* \*